US009121096B2

(12) United States Patent
Hegedus

(10) Patent No.: US 9,121,096 B2
(45) Date of Patent: Sep. 1, 2015

(54) CONCENTRIC SHOWERHEAD FOR VAPOR DEPOSITION

(75) Inventor: Andreas Hegedus, Burlingame, CA (US)

(73) Assignee: Alta Devices, Inc., Sunnyvale, CA (US)

( * ) Notice: Subject to any disclaimer, the term of this patent is extended or adjusted under 35 U.S.C. 154(b) by 1276 days.

(21) Appl. No.: 12/576,797

(22) Filed: Oct. 9, 2009

(65) Prior Publication Data
US 2010/0092668 A1  Apr. 15, 2010

Related U.S. Application Data
(60) Provisional application No. 61/104,283, filed on Oct. 10, 2008.

(51) Int. Cl.
*C23C 16/00* (2006.01)
*C23C 16/30* (2006.01)
*C23C 16/455* (2006.01)
*C23C 16/458* (2006.01)
(Continued)

(52) U.S. Cl.
CPC ........... *C23C 16/301* (2013.01); *C23C 16/4583* (2013.01); *C23C 16/45519* (2013.01); *C23C 16/45576* (2013.01); *C23C 16/481* (2013.01); *C23C 16/54* (2013.01); *Y10T 137/87571* (2015.04)

(58) Field of Classification Search
CPC .................. C23C 16/45565; C23C 16/45514; C23C 16/45572; C23C 16/45574; C23C 16/45576
USPC ........................................ 156/345.33, 345.34
See application file for complete search history.

(56) References Cited

U.S. PATENT DOCUMENTS

| 4,316,430 A | 2/1982 | Jolly et al. |
| 4,993,358 A | 2/1991 | Mahawili |

(Continued)

FOREIGN PATENT DOCUMENTS

| JP | 2004-055595 A | 2/2004 |
| JP | 2004055595 A | 2/2004 |

(Continued)

OTHER PUBLICATIONS

PCT International Search Report and Written Opinion dated May 20, 2010 for International Application No. PCT/US2009/060260.

(Continued)

*Primary Examiner* — Gordon R Baldwin
*Assistant Examiner* — Charlee Bennett
(74) *Attorney, Agent, or Firm* — Thomas Schneck; Gina McCarthy

(57) ABSTRACT

Embodiments of the invention generally relate to a concentric gas manifold assembly used in deposition reactor or system during a vapor deposition process. In one embodiment, the manifold assembly has an upper section coupled to a middle section coupled to a lower section. The middle section contains an inlet, a manifold extending from the inlet to a passageway, and a tube extending along a central axis and containing a channel along the central axis and in fluid communication with the passageway. The lower section of the manifold assembly contains a second manifold extending from a second inlet to a second passageway and an opening concentric with the central axis. The tube extends to the opening to form a second channel between the tube and an edge of the opening. The second channel is concentric with the central axis and is in fluid communication with the second passageway.

7 Claims, 26 Drawing Sheets

(51) Int. Cl.
*C23C 16/48* (2006.01)
*C23C 16/54* (2006.01)

(56) References Cited

U.S. PATENT DOCUMENTS

| | | | |
|---|---|---|---|
| 5,059,770 | A | 10/1991 | Mahawili |
| 5,122,391 | A | 6/1992 | Mayer |
| 5,304,398 | A | 4/1994 | Krusell et al. |
| 5,626,677 | A | 5/1997 | Shirahata |
| 5,792,272 | A | 8/1998 | van Os et al. |
| 6,001,267 | A | 12/1999 | Os et al. |
| 6,143,080 | A | 11/2000 | Bartholomew et al. |
| 6,508,197 | B1 * | 1/2003 | Omstead et al. ............... 118/715 |
| 7,674,352 | B2 * | 3/2010 | Bour et al. ............... 156/345.34 |
| 8,008,174 | B2 | 8/2011 | He et al. |
| 8,308,865 | B2 * | 11/2012 | Kim et al. ............... 118/715 |
| 2004/0244686 | A1 | 12/2004 | Cho et al. |
| 2005/0092248 | A1 * | 5/2005 | Lee et al. ............... 118/715 |
| 2006/0011298 | A1 * | 1/2006 | Lim et al. ............... 156/345.34 |
| 2006/0021703 | A1 * | 2/2006 | Umotoy et al. ............... 156/345.34 |
| 2006/0249077 | A1 | 11/2006 | Kim et al. |
| 2006/0263522 | A1 * | 11/2006 | Byun ............... 427/248.1 |
| 2007/0092732 | A1 | 4/2007 | Rose et al. |
| 2007/0272154 | A1 * | 11/2007 | Amikura et al. ............... 118/719 |
| 2009/0324379 | A1 | 12/2009 | He et al. |
| 2009/0325367 | A1 | 12/2009 | He et al. |
| 2010/0003405 | A1 * | 1/2010 | Kappeler ............... 427/255.28 |
| 2010/0092668 | A1 | 4/2010 | Hegedus |
| 2010/0206229 | A1 | 8/2010 | He et al. |
| 2010/0206235 | A1 | 8/2010 | He et al. |
| 2010/0209082 | A1 | 8/2010 | He et al. |
| 2010/0209620 | A1 | 8/2010 | He et al. |
| 2010/0209626 | A1 | 8/2010 | He et al. |
| 2010/0212591 | A1 | 8/2010 | He et al. |
| 2010/0229793 | A1 | 9/2010 | He et al. |
| 2010/0300359 | A1 * | 12/2010 | Armour et al. ............... 118/724 |
| 2011/0268880 | A1 | 11/2011 | Bour |

FOREIGN PATENT DOCUMENTS

| | | |
|---|---|---|
| JP | 2007-231361 | 9/2007 |
| JP | 2007231361 A | 9/2007 |
| KR | 10-0220444 B1 | 9/1999 |
| KR | 100220444 B1 | 9/1999 |
| WO | WO2010107835 A2 | 9/2010 |
| WO | WO2010107837 A2 | 9/2010 |
| WO | WO2010107839 A2 | 9/2010 |
| WO | WO2010107843 A2 | 9/2010 |

OTHER PUBLICATIONS

PCT International Search Report and Written Opinion for International Application No. PCT/US2009/045709, dated Jan. 12, 2010.
PCT Int'l Search Report and Written Opinion for Int'l Application No. PCT/US2009/045709 dated Jan. 12, 2010.
PCT Int'l Search Report and Written Opinion for Int'l Application No. PCT/US2009/060260.

* cited by examiner

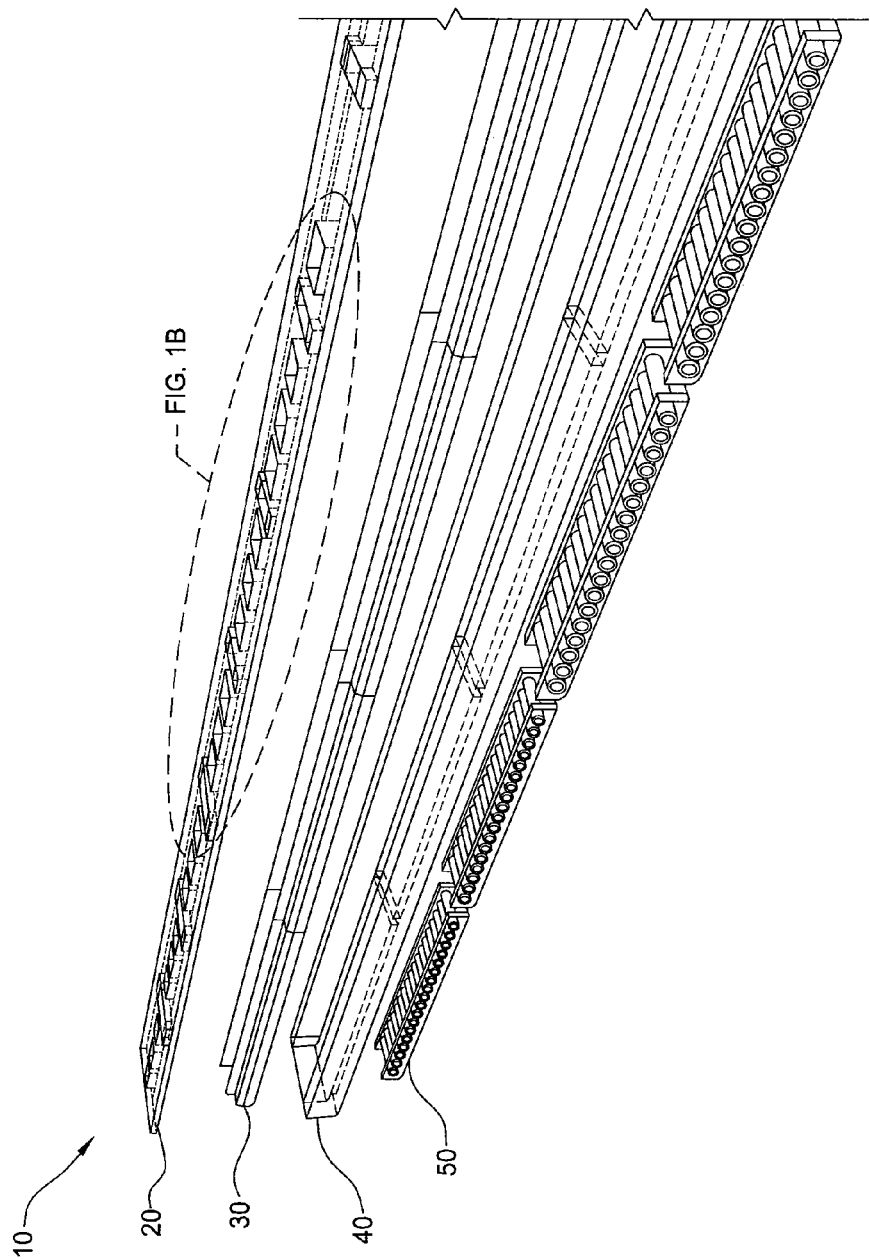

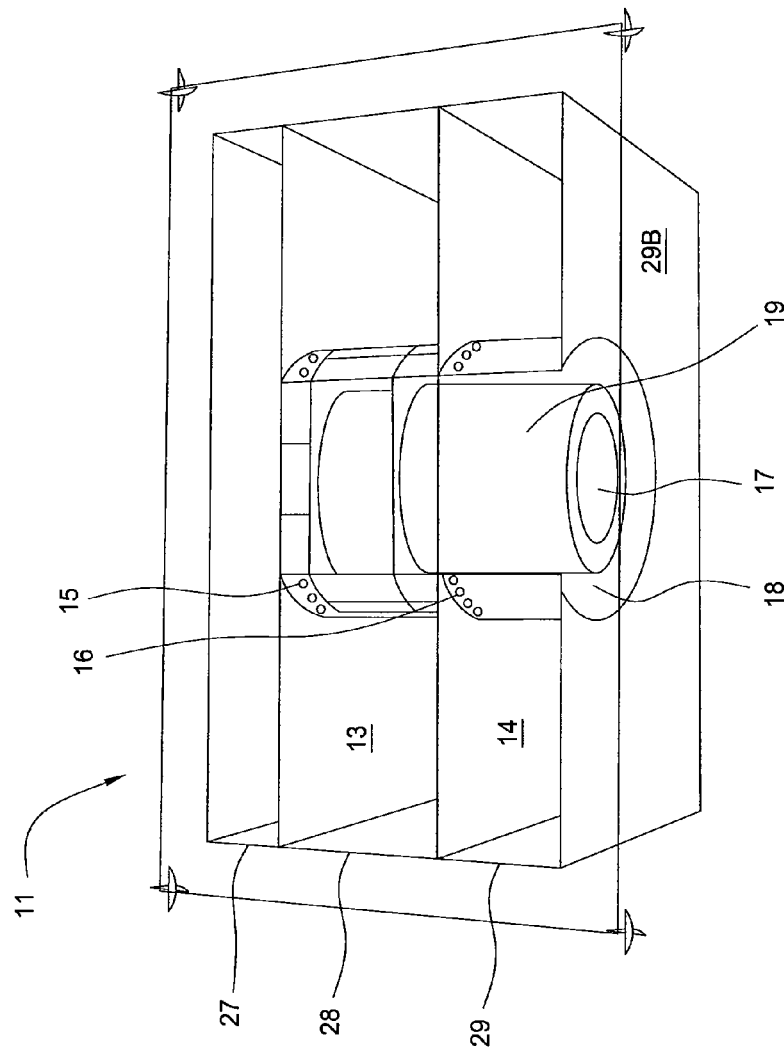

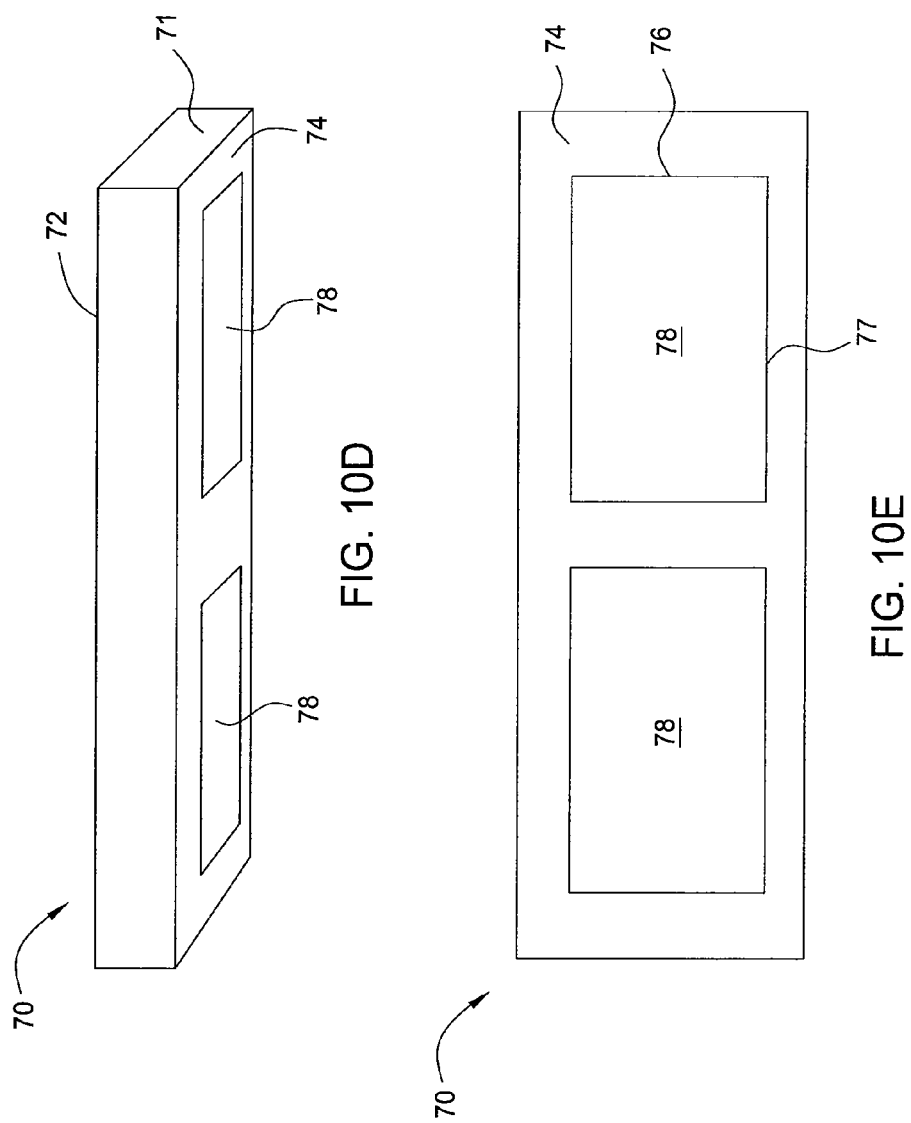

CONCENTRIC SHOWERHEAD FOR VAPOR DEPOSITION

CROSS-REFERENCE TO RELATED APPLICATION

This application claims benefit of U.S. Ser. No. 61/104,283, filed Oct. 10, 2008, which is hereby incorporated by reference in its entirety.

BACKGROUND OF THE INVENTION

1. Field of the Invention

Embodiments of the invention generally relate to methods and apparatuses for vapor deposition, and more particularly, to chemical vapor deposition processes and chambers.

2. Description of the Related Art

Chemical vapor deposition ("CVD") is the deposition of a thin film on a substrate by the reaction of vapor phase chemicals. Chemical vapor deposition reactors are used to deposit thin films of various compositions on the substrate. CVD is highly utilized in many activities, such as the semiconductor industry.

There are numerous types of CVD reactors for very different applications. For example, one type of reactor includes atmospheric pressure reactors and another type of reactor includes low-pressure reactors. These distinct designs address a variety of challenges that are encountered during a CVD process, such as depletion effects, contamination issues, and reactor maintenance.

Notwithstanding the many different reactor and system designs, there is a continuous need for new and improved CVD reactor and system designs, as well as gas manifolds for vapor deposition processes.

SUMMARY OF THE INVENTION

Embodiments of the invention generally relate to a concentric gas manifold assembly used in a vapor deposition reactor or system. In many embodiments, the concentric gas manifold assembly may be used in a reactor or system for growing epitaxial films in a continuous manner. In one embodiment, the concentric gas manifold assembly for vapor deposition processes is provided which includes lower, middle, and upper sections. The upper section is coupled to the middle section and the middle section is coupled to the lower section. The middle section contains a first gas inlet, a first gas manifold extending from the first gas inlet to a first passageway, and a tube extending along a central axis and containing a first channel along the central axis. The first passageway may be in fluid communication with the first channel. The lower section contains a second gas inlet, a second gas manifold extending from the second gas inlet to a second passageway, and an opening concentric with the central axis. The tube extends to the opening to form a second channel between the tube and an edge of the opening. The second channel may be concentric with the central axis, and the second passageway may be in fluid communication with the second channel.

In some examples, the tube has a cylindrical geometry and the opening has a circular geometry. In other examples, the tube extends through the opening and past a lower surface of the lower section. The second channel usually extends parallel to the first channel and the central axis. Each of the upper section, the middle section, and the lower section may independently contain or be made from molybdenum, molybdenum alloys, steel, stainless steel, nickel, chromium, iron, or alloys thereof. Also, the tube may contain or be made from molybdenum, molybdenum alloys, steel, stainless steel, nickel, chromium, iron, or alloys thereof.

In another embodiment, a method for forming a material on a substrate surface is provided which contains positioning a substrate below a gas manifold assembly during a vapor deposition process and flowing a first process gas along a first gas flow path of a middle section of the gas manifold assembly. The middle section may contain a first gas inlet, a first gas manifold extending from the first gas inlet to a first passageway, and a tube extending along a central axis and containing a first channel along the central axis, wherein the first passageway is in fluid communication with the first channel. The method further includes flowing a second process gas along a second gas flow path of a lower section of the gas manifold assembly, the lower section comprises and exposing the substrate to the first process gas and the second process gas while depositing a material thereon. The lower section may contain a second gas inlet, a second gas manifold extending from the second gas inlet to a second passageway, and an opening concentric with the central axis, wherein the tube extends to the opening to form a second channel between the tube and an edge of the opening, the second channel is concentric with the central axis, and the second passageway is in fluid communication with the second channel.

In other embodiments, the method further provides that the second process gas encompasses the first process gas while flowing between the gas manifold assembly and the substrate. The gas manifold assembly may further contain an upper section coupled to the middle section and the middle section is coupled to the lower section. The vapor deposition process may be a thermal CVD process.

In another embodiment, the vapor deposition reactor or system (e.g., CVD reactor or system) containing a concentric gas manifold assembly is provided which includes an entrance isolator operable to prevent contaminants from entering the system at an entrance of the system, an exit isolator operable to prevent contaminants from entering the system at an exit of the system, a intermediate isolator disposed between the entrance and exit isolators, a first deposition zone disposed adjacent the entrance isolator, a second deposition zone disposed adjacent the exit isolator, and the concentric gas manifold assembly coupled with and in fluid communication with the first deposition zone.

The concentric gas manifold assembly coupled with the vapor deposition reactor or system further has a middle section containing a first gas inlet, a first gas manifold extending from the first gas inlet to a first passageway, and a tube extending along a central axis and containing a first channel along the central axis. The first passageway may be in fluid communication with the first channel. In some embodiments, the concentric gas manifold assembly may have a lower section containing a second gas inlet, a second gas manifold extending from the second gas inlet to a second passageway, and an opening concentric with the central axis. The tube may extend to the opening to form a second channel between the tube and an edge of the opening, the second channel is concentric with the central axis, and the second passageway is in fluid communication with the second channel.

In other embodiments, the concentric gas manifold assembly may further have an upper section coupled to the middle section and the middle section may be coupled to the lower section. The tube may have a cylindrical geometry and the opening has a circular geometry. The tube extends through the opening and past a lower surface of the lower section. The second channel extends parallel to the first channel and the central axis. The intermediate isolator is disposed between the deposition zones and is operable to prevent mixing of gases between the first deposition zone and the second deposition zone.

The vapor deposition reactor or system containing the concentric gas manifold assembly may have a gas injected into the entrance isolator at a first flow rate to prevent back diffusion of gases from the first deposition zone. The gas may be injected into the intermediate isolator at a first flow rate to prevent back mixing of gases between the first deposition zone and the second deposition zone. Another gas may be injected into the exit isolator at a first flow rate to prevent contaminants from entering the system at the exit of the system. The vapor deposition reactor or system may further have an exhaust disposed adjacent each isolator and operable to exhaust gases injected by the isolators. The exhaust may be disposed adjacent each deposition zone and operable to exhaust gases injected into the deposition zones.

BRIEF DESCRIPTION OF THE DRAWINGS

So that the manner in which the above recited features of the invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIG. 1A depicts a chemical vapor deposition reactor according to one embodiment of the invention;

FIGS. 4B-4E depict a gas manifold assembly according to another embodiment described herein;

FIGS. 10D-10F depict other levitating wafer carriers according to another embodiment described herein;

DETAILED DESCRIPTION

Embodiments of the invention generally relate to an apparatus and a method of chemical vapor deposition ("CVD"). As set forth herein, embodiments of the invention is described as they relate to an atmospheric pressure CVD reactor and metal-organic precursor gases. It is to be noted, however, that aspects of the invention are not limited to use with an atmospheric pressure CVD reactor or metal-organic precursor gases, but are applicable to other types of reactor systems and precursor gases. To better understand the novelty of the apparatus of the invention and the methods of use thereof, reference is hereafter made to the accompanying drawings.

According to one embodiment of the invention, an atmospheric pressure CVD reactor is provided. The CVD reactor may be used to provide multiple epitaxial layers on a substrate, such as a wafer, such as a gallium arsenide wafer. These epitaxial layers may include aluminum gallium arsenide, gallium arsenide, and phosphorous gallium arsenide. These epitaxial layers may be grown on the gallium arsenide wafer for later removal so that the wafer may be reused to generate additional materials. In one embodiment, the CVD reactor may be used to provide solar cells. These solar cells may further include single junction, heterojunction, or other configurations. In one embodiment, the CVD reactor may be configured to develop a wafer which produces about 2.5 watts and has the dimension of about 10 cm by about 10 cm. In one embodiment, the CVD reactor may provide a throughput range of about 1 wafer per minute to about 10 wafers per minute.

Figure 1B:
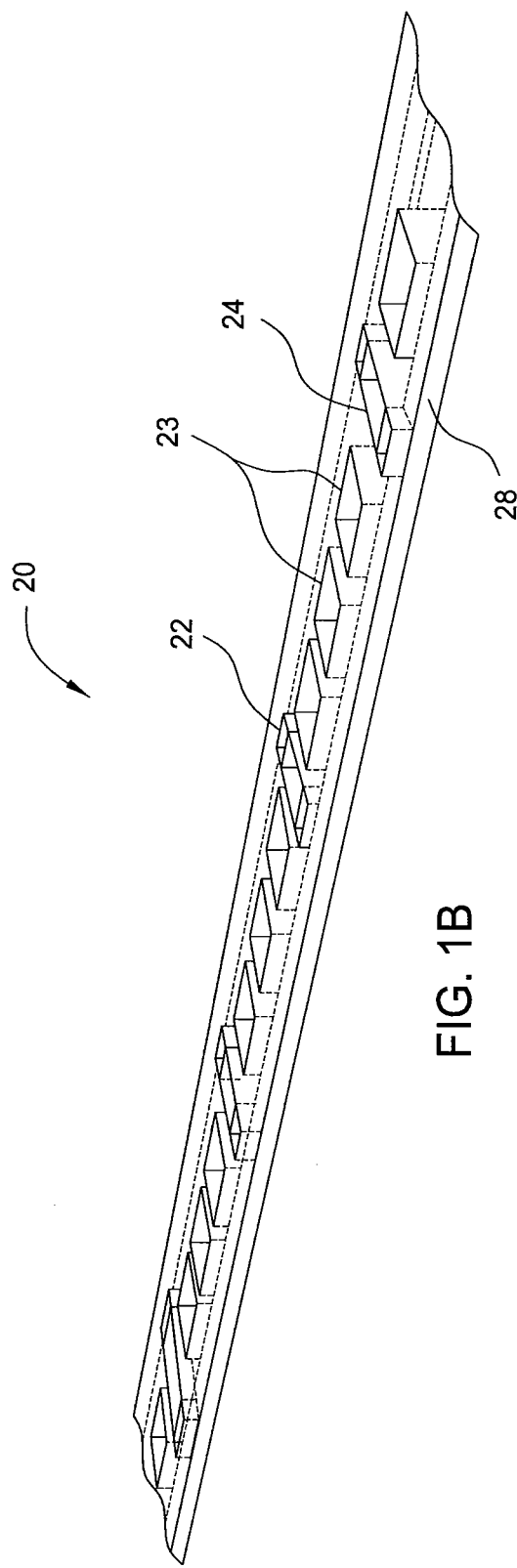
FIG. 1B depicts a perspective view of a reactor lid assembly according to one embodiment of the invention.

FIG. 1A shows a CVD reactor 10, according to one embodiment of the invention. The reactor 10 includes a reactor lid assembly 20, a wafer carrier track 30, a wafer carrier track support 40, and a heating lamp assembly 50. The reactor lid assembly 20 may be formed from molybdenum, molybdenum alloys, stainless steel, and quartz. The reactor lid assembly 20 is disposed on the wafer carrier track 30. The wafer carrier track 30 may be formed from quartz, molybdenum, silica (such as fused silica), alumina, or other ceramic materials. The wafer carrier track 30 may be seated in a wafer carrier track support 40. The wafer carrier track support 40 may be formed from quartz or a metal, such as molybdenum, molybdenum alloys, steel, stainless steel, nickel, chromium, iron, or alloys thereof. Finally, a heating lamp assembly 50 (further discussed below with respect to FIG. 10) is disposed below the wafer carrier track support 40. The overall CVD reactor length may be in a range of about 18 feet to about 25 feet, but may extend beyond this range for different applications.

Figure 2:
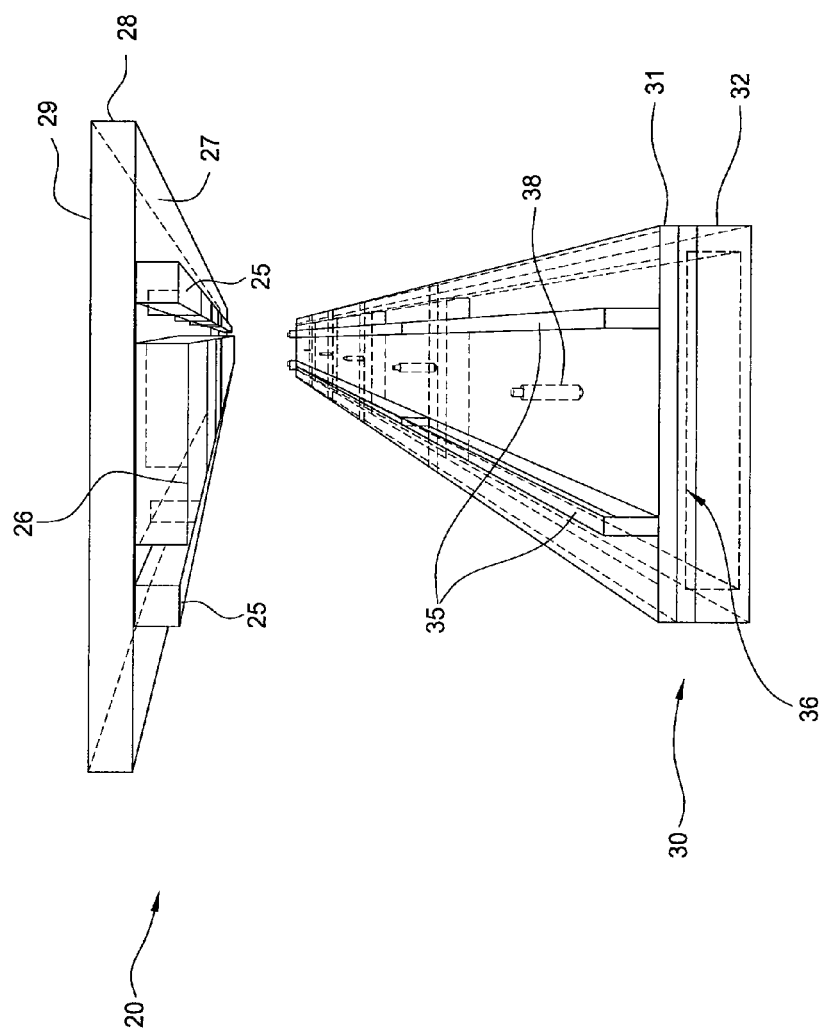
FIG. 2 depicts a side perspective view of the chemical vapor deposition (CVD) reactor according to one embodiment described herein.
Figure 3:
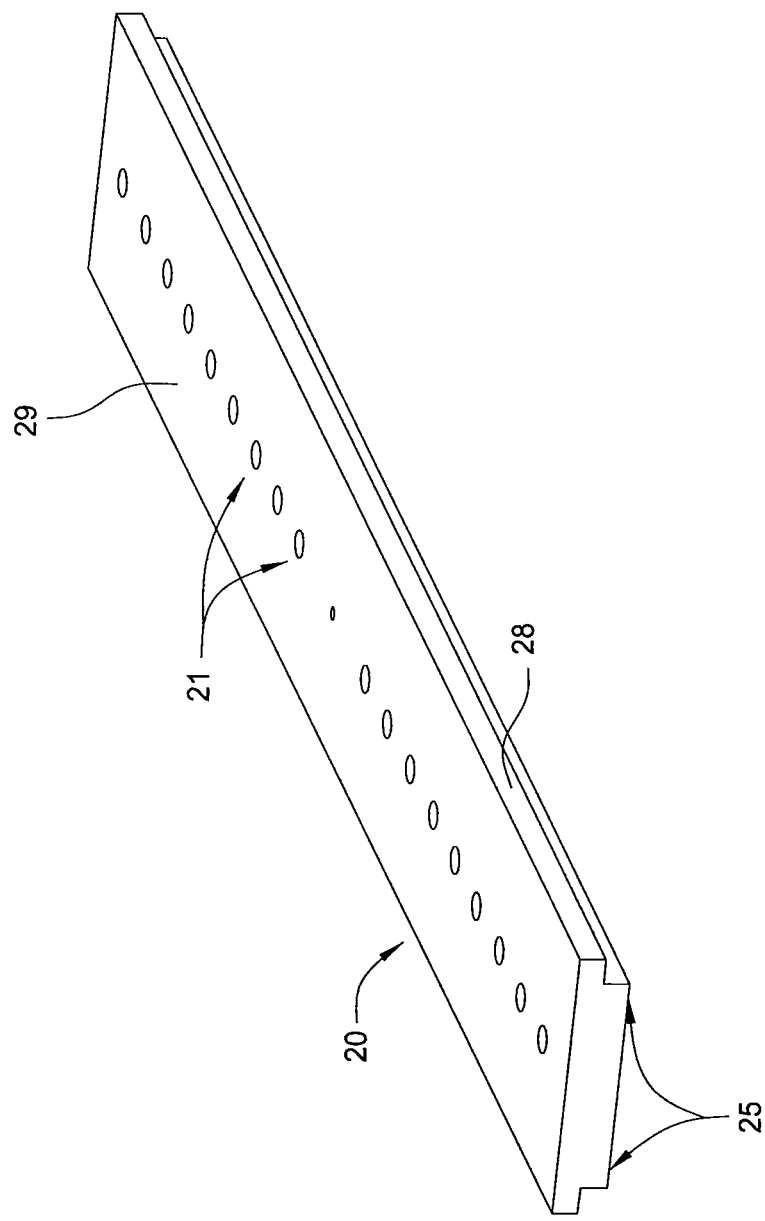
FIG. 3 depicts a reactor lid assembly of the CVD reactor according to one embodiment described herein.
Figure 4A:
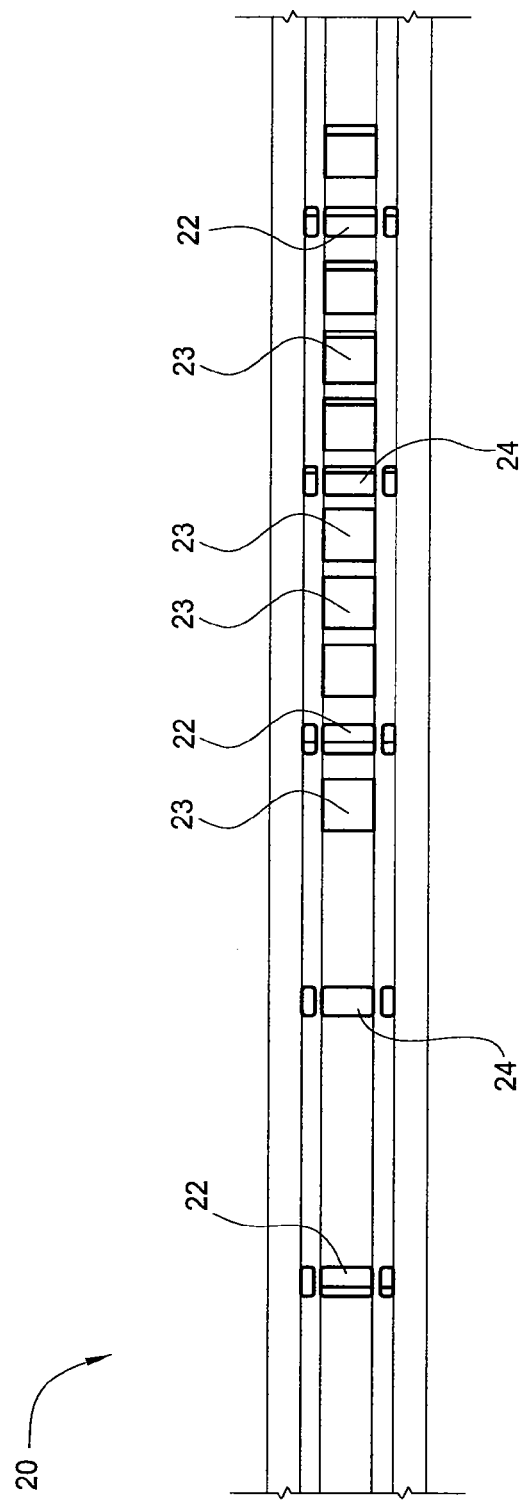
FIG. 4A depicts a top view of a top plate of the CVD reactor according to another embodiment described herein.
Figure 4B:
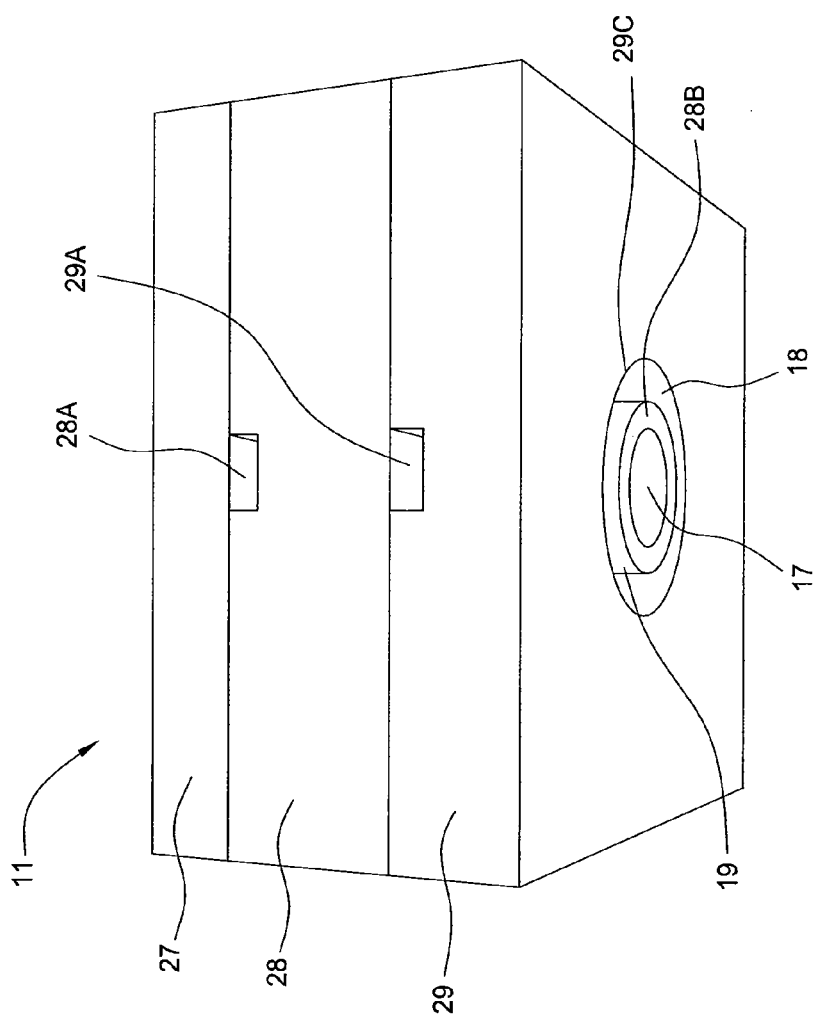
Figure 4D:
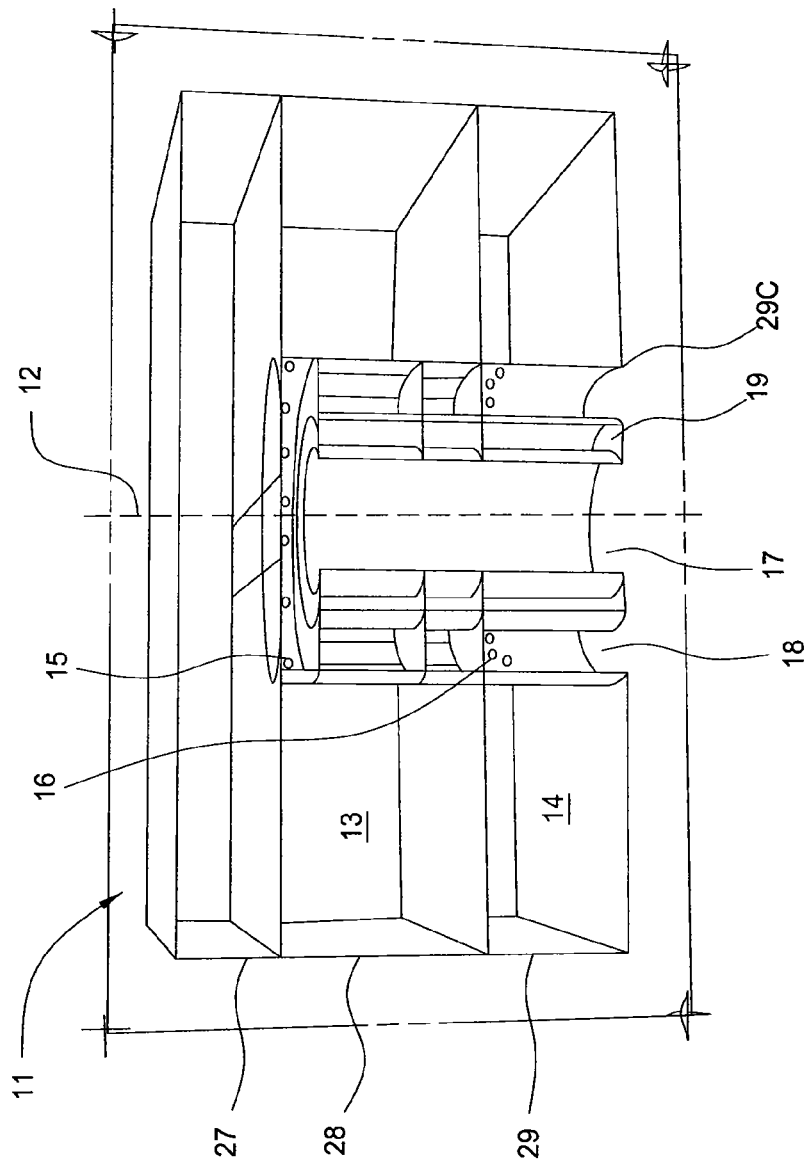

FIGS. 2, 3, and 4A provide various views of embodiments of the reactor lid assembly 20. Referring to FIG. 2, the reactor lid assembly 20 forms a rectangular body having sidewalls 25 extending from the bottom surface of the reactor lid assembly 20, and having a plurality of raised portions 26 centrally located between the sidewalls 25. The raised portions 26 may extend from the bottom surface of the top plate at different lengths along the reactor lid assembly 20. The raised portions 26 are disposed between the sidewalls 25 so that clearances are formed between the raised portions 26 and each sidewall 25. These clearances may be used to help couple the reactor lid assembly 20 to the track 30 (further described below). Both the sidewalls 25 and the raised portions 26 may extend substantially the longitudinal length of the reactor lid assembly 20. The reactor lid assembly 20 may be formed as a single solid structural component, or it may be constructed from several segments coupled together. The raised portions 26 may vary in length and number, thereby forming "zones" which may be utilized for different applications in a CVD process. The reactor lid assembly 20 may also include multiple patterns of raised portions 26 along its length, such as to develop numerous layouts or stages in a CVD process.

FIG. 3 also shows the reactor lid assembly 20. As stated above, the reactor lid assembly 20 as shown in FIG. 3 may represent an entire top plate structure or a single segment of a larger constructed top plate structure. Also shown, is a plurality of ports 21 disposed through the top surface of the reactor lid assembly 20 and centrally located along the longitudinal axis of the reactor lid assembly 20. The ports 21 may vary in size, shape, number, and location along the top surface of the reactor lid assembly 20. The ports 21 may be used as injection, deposition, and/or exhaust ports for communicating a gas, into the CVD reactor. Generally, each port 21 is disposed between two adjacent raised portions 26 (as show in FIG. 2), thereby forming "paths" through which injection, deposition, and/or exhaustion of a gas may take place. In one example, a gas may be injected into a port 21 so that the gas first travels along the sides of the adjacent raised portions 26 and then travels along the bottom surfaces of the raised portions 26 and into the flow path of a substrate. As shown in FIG. 3, the sidewalls 25 are enclosed at the ends of the reactor lid assembly 20 to encapsulate any fluids that are communicated to the "zones" and "paths" created by the ports 21 and the raised portions 26 of the reactor lid assembly 20.

FIG. 4A shows a top view of the reactor lid assembly 20 having deposition ports 23, injection ports 22, and exhaust ports 24. The deposition ports 23 may be fitted with removable showerheads or gas manifold assemblies to facilitate distribution of a gas, into the CVD reactor, and specifically to uniformly apply the gas to a substrate passing beneath the showerhead. The showerheads may include injection hole diameters in the range of about 0.1 millimeters to about 5 millimeters, and may include injection hole spacing in the range of about 1 millimeter to about 30 millimeters. These dimensions may extend beyond these ranges for different applications. The showerheads and the reactor lid assembly 20 may be configured to provide a high reactant utilization, meaning that the gases utilized in the reactor are consumed by the reactions during the CVD process.

FIGS. 4B-4E depict the gas manifold assembly 11 which may be fitted to a deposition port 23 in other embodiments herein. In another embodiment, the gas manifold assembly 11 may be fitted to injection ports 22 for flowing various gases (e.g., Ar or $N_2$) into a chamber, reactor, or system while forming isolation curtains. In an alternative embodiment, the gas manifold assembly 11 may be fitted to exhaust ports 24 for flowing gases from the chamber, reactor, or system by a vacuum system or pump.

The injection ports 22 and the exhaust ports 24 may be used to develop "isolation curtains" to help prevent contamination and to help prevent back diffusion of the gases introduced into the CVD reactor 10 between the various zones created in the reactor. These "isolation curtains" may be introduced at the front end (entrance) and the back end (exit) of the CVD reactor 10, as well as between the various zones created within the CVD reactor 10. In one example, nitrogen or argon may be injected into an injection port 22 to purge contaminants, such as oxygen, out of a particular zone, which are then exhausted out of an adjacent exhaust port 24. By utilizing the "isolation curtains" with the "paths" and "zones" created by the reactor lid assembly 20, the CVD reactor 10 limits the gas isolation to a two dimension configuration that protects between zones and isolates the reactor from outside contaminants, such as air.

FIGS. 4B-4E depict a gas manifold assembly 11 which may be used in the CVD reactor 10 according other embodiments described herein. The gas manifold assembly 11 contains an upper section 27, a middle section 28, and a lower section 29. The middle section 28 is coupled between the upper section 27 and the lower section 29. The middle section 28 contains a gas inlet 28A in fluid communication and coupled with gas manifold 13. Similarly, the lower section 29 contains a gas inlet 29A in fluid communication and coupled with gas manifold 14. The middle section 28 contains a tube 19, which extends from the middle section 28 to the opening 29C of the lower section 29. Opening 29C extends completely through the lower section 29. The channel 18 extends between the outer surface of the tube 19 and the inner surface of the opening 29C. The tube 19 contains a channel 17 extending therethrough.

In one embodiment, channels 17 and 18 and tube 19 are concentric with each other and positioned along a common axis, such as the central axis 12. In one example, the middle section 28 and the tube 19 are separate pieces which are coupled together. In another example, the middle section 28 and the tube 19 are a single piece formed together. Each of the upper section 27, the middle section 28, the lower section 29, and the tube 19 may independently contain a material or is formed from the same material or different materials, such as molybdenum, molybdenum alloys, steel, stainless steel, nickel, chromium, iron, alloys thereof, or combinations thereof.

Figure 4E:
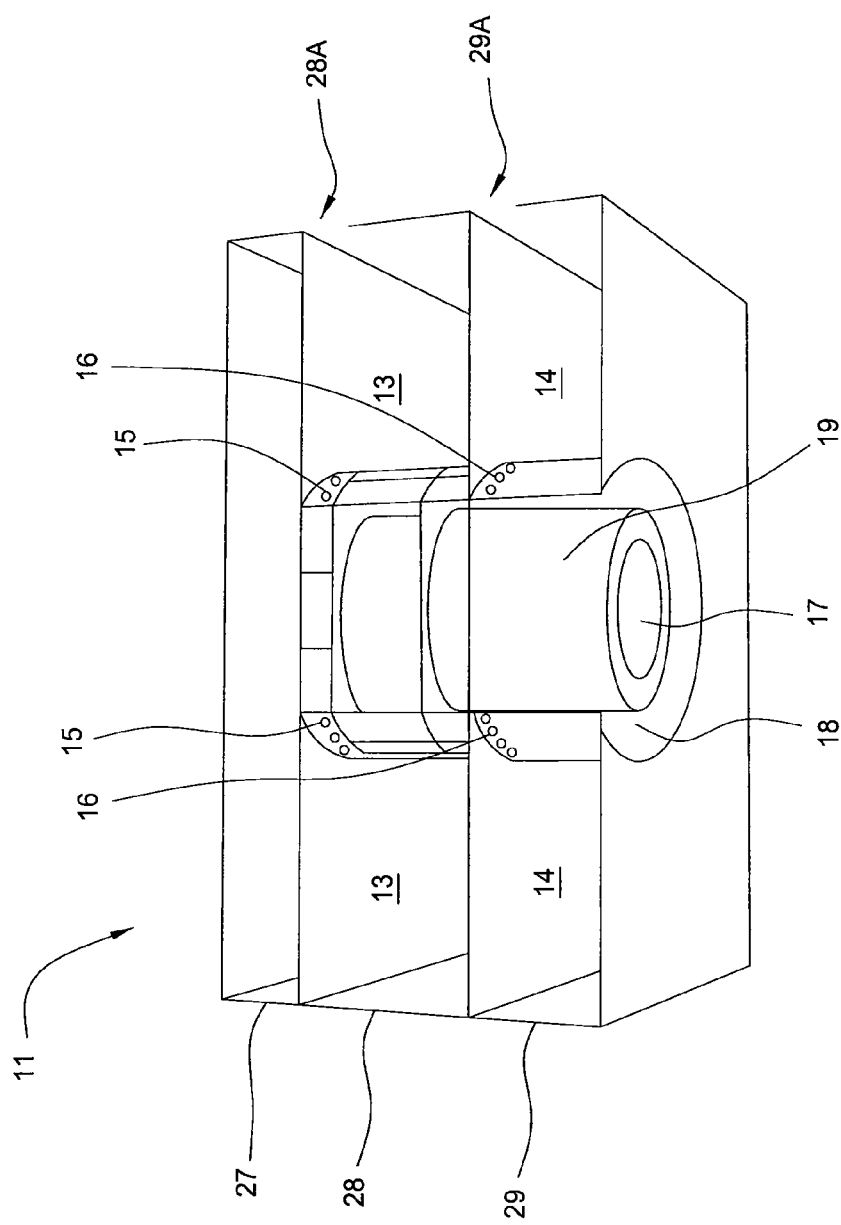

The gas manifold assembly 11 contains at least two independent and exclusive gas flow paths, as illustrated in FIG. 4E. A first gas flow path extends from the gas inlet 28A, through the gas manifold 13 of the middle section 28, through passageways 15, and into the channel 17 of the tube 19. A second gas flow path extends from the gas inlet 29A, through the gas manifold 14 of the lower section 29, through passageways 16, and into the channel 18 formed between the opening 29C and the tube 19. Upon exiting the gas manifold assembly 11, the first and second gas flow paths are concentric and flow parallel to the central axis 12, as described in one embodiment herein.

The first and second gas flow paths remain independent with the second gas flow path encompassing the first gas flow path. Therefore, two process gases, which are chemically reactive towards each other, may be simultaneously delivered to a substrate by flowing one of the process gases along the first gas flow path and flowing the other process gas along the second gas flow path. The two process gases do not mix or do not substantially combine while exiting the gas manifold assembly 11. In another example, an inert gas may be flowed along the second gas flow path and be used as an isolation curtain to a process gas flowing along the first gas flow path.

In one embodiment, the lower surface 28B of the tube 19 is flush with the lower surface 29B of lower section 29, as depicted in FIGS. 4B-4E. However, in another embodiment, not shown, the tube 19 has a longer length such that the lower surface 28B protrudes from opening 29C and past the horizontal plane of the lower surface 29B of lower section 29.

Alternatively, in another embodiment, not shown, the tube 19 has a shorter length such that the lower surface 28B does not protrude from the opening 29C or past the horizontal plane of the lower surface 29B of lower section 29.

While FIGS. 4B-4E depict the tube 19 as having a cylindrical shape and the opening 29C as being round, in other examples, the tube 19 and/or the opening 29C may have alternative shapes or geometries. For example, the tube 19 and the opening 29C may be rectangular or square. In alternative embodiments, the gas manifold assembly 11 may have additional sections, such as a second middle section or a third middle section. Each additional middle section may be similar to the middle section 28, but have a tube having a larger or smaller diameter than the tube 19. Each additional middle section may be positioned above or below the middle section 28, such as between the middle section 28 and the upper section 27 or between the middle section 28 and the lower section 29. Each additional tube containing a channel may be positioned along the central axis 12 and be concentric with the channel 18 and the tube 19. Therefore, each additional middle section has a gas flow path independent and separate form the first and second gas flow paths. Each additional gas flow path extends from a gas inlet, through a gas manifold of the additional middle section, a passageway, and into the channel within the additional tube.

FIGS. 2, 5, 6, 7, and 8 provide various views of embodiments of the wafer carrier track 30. The wafer carrier track 30 may provide a levitation-type system so that a wafer may float across a cushion of a gas, such as nitrogen or argon, supplied from the gas holes 33 of the wafer carrier track 30. Referring back to FIG. 2, the wafer carrier track 30 generally may be a rectangular body having an upper portion 31 and a lower portion 32. The upper portion 31 includes side surfaces 35 extending from the top surface of the wafer carrier track 30 and disposed along the longitudinal length of the wafer carrier track 30, thereby forming a "guide path" along which a wafer travels through the CVD reactor. The width of the guide path (e.g. the distance between the inner sides of the side surfaces 35) may be in a range of about 110 millimeters to about 130 millimeters, the height of the guide path may be in a range of about 30 millimeters to about 50 millimeters, and the length of the guide path may be in a range of about 970 millimeters to about 1030 millimeters, however, these dimensions may extend beyond these ranges for different applications. The upper portion 31 may include a recessed bottom surface, and the bottom section may include a recessed top surface, such that when joined together, a gas cavity 36 is formed therebetween. The gas cavity 36 may be used to circulate and distribute gas that is injected into the gas cavity 36 to the guide path of the wafer carrier track 30 to generate the cushion of gas. The number, size, shape, and location of the gas cavity 36 along the wafer carrier track 30 may vary. Both the side surfaces 35 and the gas cavity 36 may extent substantially the longitudinal length of the wafer carrier track 30. The wafer carrier track 30 may be formed as a single solid structural component, or it may be constructed from several segments coupled together. In one embodiment, the wafer carrier track 30 may be tilted at an angle, such that the entrance is elevated above the exit, so that the wafers may float down the track with the aid of gravity. As discussed above, the side surfaces 35 of the wafer carrier track 30 may be received into the gaps formed between the raised portions 26 and the flange members 25 of the reactor lid assembly 20 to enclose the "guide path" along the wafer carrier track 30 and to further compassing the "zones" formed with the raised portions 26 along the wafer carrier track 30.

Figure 5:
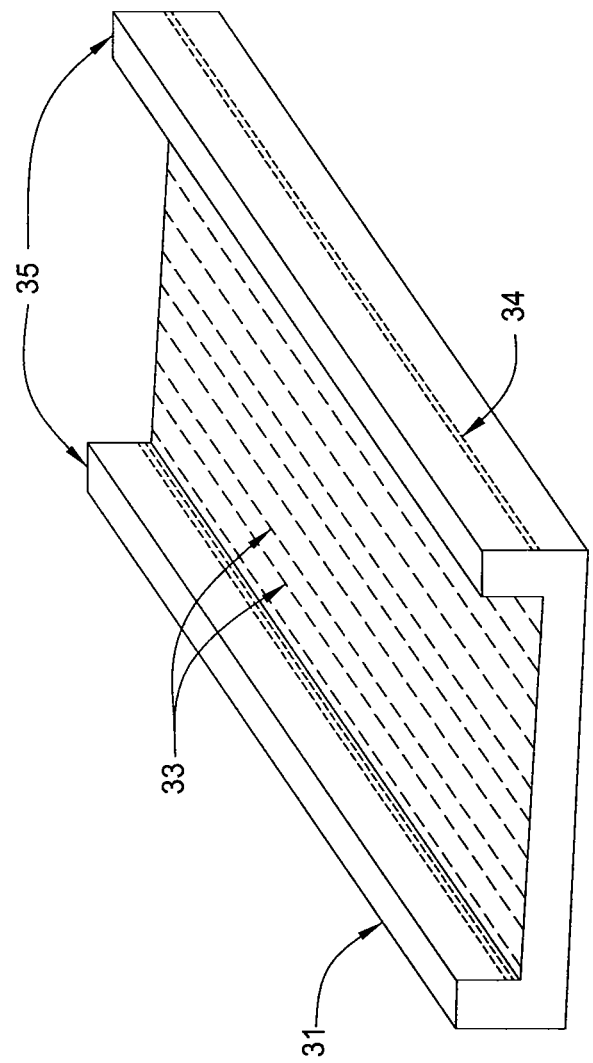
FIG. 5 depicts a wafer carrier track of the CVD reactor according to one embodiment described herein.

FIG. 5 shows an embodiment of the wafer carrier track 30. As shown, wafer carrier track 30 includes a plurality of gas holes 33 along the guide path of the wafer carrier track 30 and between the side surfaces 35. The gas holes 33 may be uniformly disposed along the guide path of the wafer carrier track 30 in multiple rows. The diameter of the gas holes 33 may include a range of about 0.2 millimeters to about 0.10 millimeters and the pitch of the gas holes 33 may include a range of about 10 millimeters to about 30 millimeters, but these dimensions may extend beyond these ranges for different applications. The number, size, shape, and location of the gas holes 33 along the wafer carrier track 30 may vary. In an alternative embodiment, the gas holes 33 may include rows of rectangular slits or slots disposed along the guide path of the wafer carrier track 30.

Gas holes 33 are in communication with the gas cavity 36 disposed beneath the guide path of the wafer carrier track 30. Gas that is supplied to the gas cavity 36 is uniformly released through the gas holes 33 to develop a cushion of gas along the wafer carrier track 30. A wafer positioned on the guide path of the wafer carrier track 30 may be levitated by the gas supplied from underneath and easily transported along the guide path of the wafer carrier track 30. The gap between a levitated wafer and the guide path of the wafer carrier track 30 may be greater than about 0.05 millimeters, but may vary depending on different applications. This levitation-type system reduces any drag effects produced by continuous direct contact with the guide path of the wafer carrier track 30. In addition, gas ports 34 may be provided along the sides of the side surfaces 35 adjacent the guide path of the wafer carrier track 30. These gas ports 34 may be used as an exhaust for the gas that is supplied through the gas holes 33. Alternatively, these gas ports 34 may be used to inject gas laterally into the center of the wafer carrier track 30 to help stabilize and center a wafer that is floating along the guide path of the wafer carrier track 30. In an alternative embodiment, the guide path of the wafer carrier track 30 may include a tapered profile to help stabilize and center a wafer that is floating along the guide path of the wafer carrier track 30.

Figure 6:
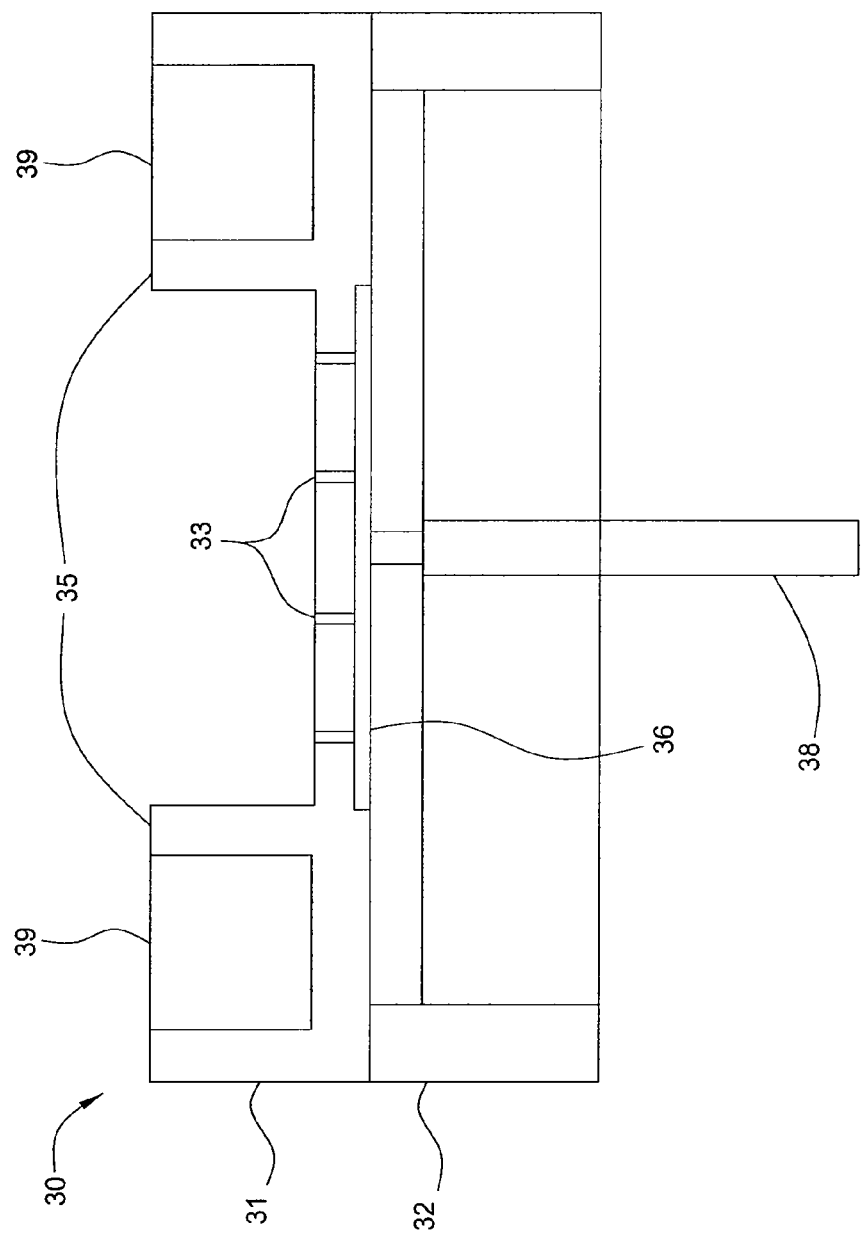
FIG. 6 depicts a front view of the wafer carrier track of the CVD reactor according to one embodiment described herein.

FIG. 6 shows a front view embodiment of the wafer carrier track 30. As shown, the wafer carrier track 30 includes the upper portion 31 and the lower portion 32. The upper portion 31 includes side surfaces 35 that form the "guide path" along the length of the wafer carrier track 30. The upper portion 31 may further include side surfaces 35 that form recessed portions 39 between the sides of the side surfaces 35. These recessed portions 39 may be adapted to receive the flange members 25 of the reactor lid assembly 20 (shown in FIG. 2) to couple the reactor lid assembly 20 and the wafer carrier track 30 together and enclose the guide path along the wafer carrier track 30. Also show in FIG. 5 are gas holes 33 extending from the guide path of the wafer carrier track 30 to the gas cavity 36. The lower portion 32 may act as a support for the upper portion 31 and may include a recessed bottom surface. An injection line 38 may be connected to the lower portion 32 so that gas may be injected through the line 38 and into the gas cavity 36.

Figure 7:
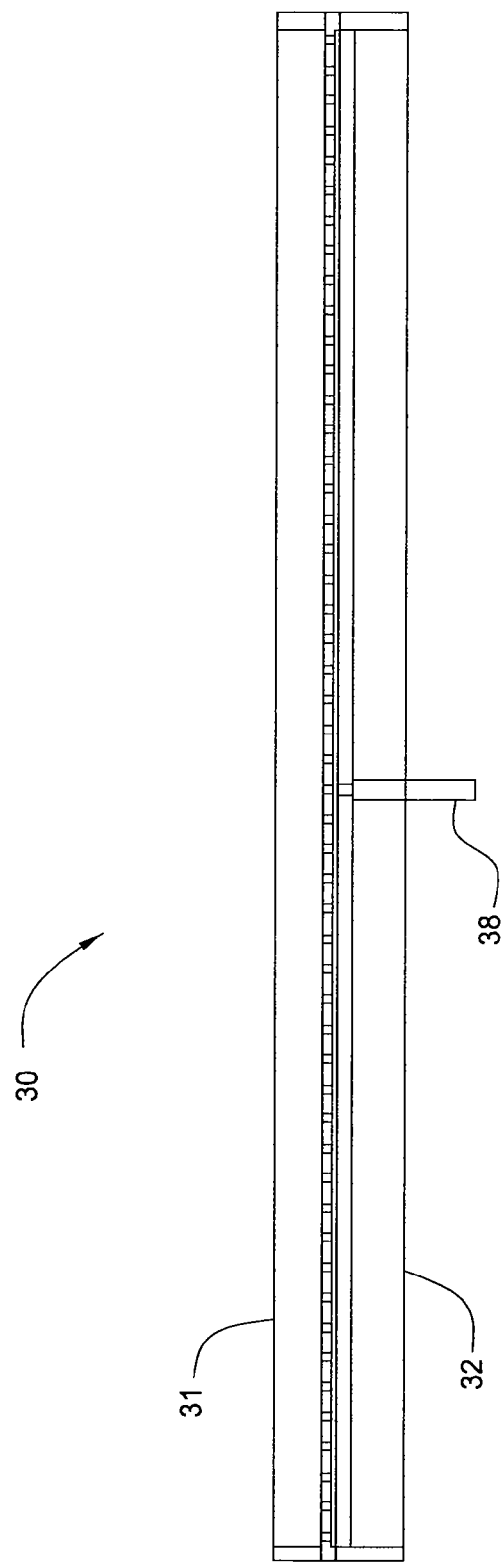
FIG. 7 depicts a side view of the wafer carrier track of the CVD reactor according to one embodiment described herein.

FIG. 7 shows a side view of the wafer carrier track 30 having a single injection line 38 into a gas cavity 36 along the entire wafer carrier track 30 length. Alternatively, the wafer carrier track 30 may include multiple gas cavities 36 and multiple injection lines 38 along its length. Alternatively still, the wafer carrier track 30 may include multiple segments, each segment having a single gas cavity and a single injection line 38. Alternatively still, the wafer carrier track 30 may include combinations of the above described gas cavity 36 and injection line 38 configurations.

Figure 8:
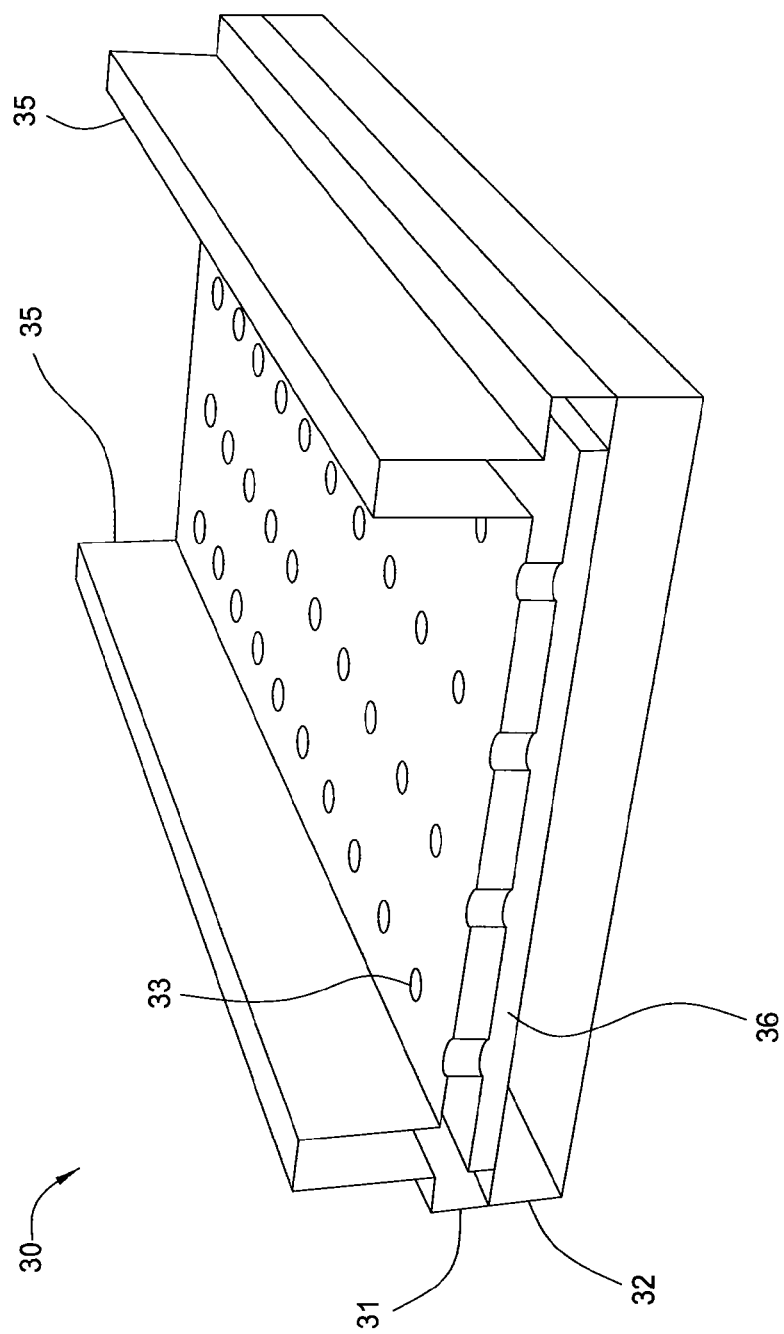
FIG. 8 depicts a perspective view of the wafer carrier track of the CVD reactor according to one embodiment described herein.

FIG. 8 shows a cross sectional perspective view embodiment of the wafer carrier track 30 having the upper portion 31 and the lower portion 32. The upper portion 31 having side surfaces 35, gas holes 33, and the gas cavity 36 disposed on the lower portion 32. In this embodiment, the side surfaces 35 and the lower portion 32 are hollow, which may substantially reduce the weight of the wafer carrier track 30 and may enhance the thermal control of the wafer carrier track 30 relative to the wafers traveling along the wafer carrier track 30.

Figure 9:
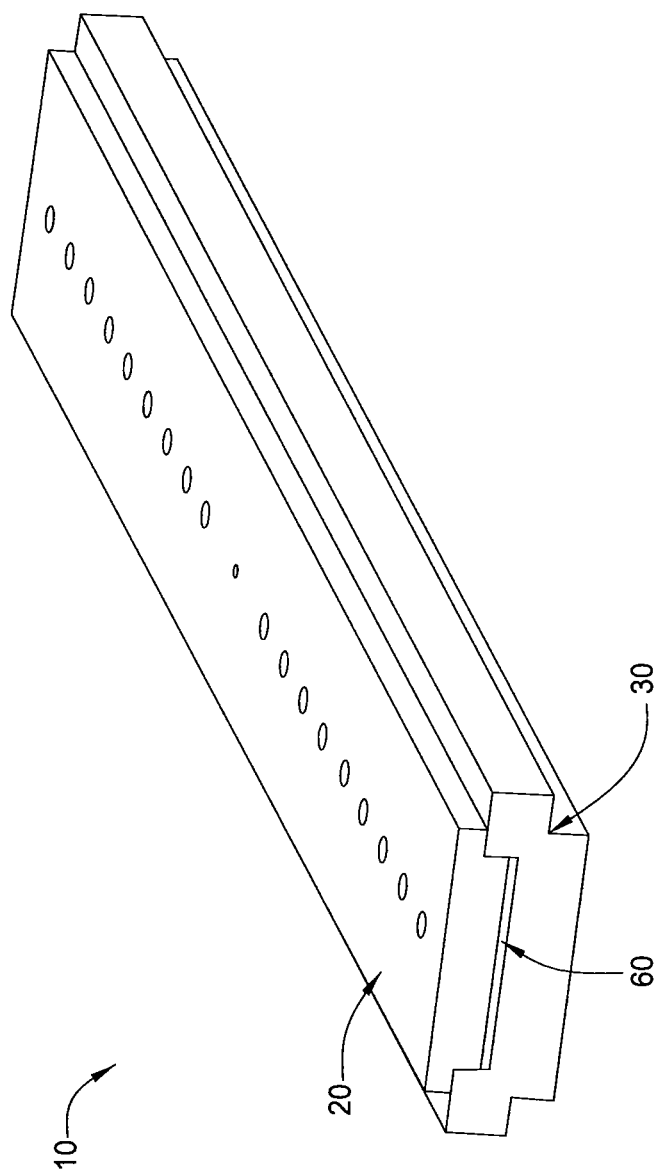
FIG. 9 depicts the reactor lid assembly and the wafer carrier track of the CVD reactor according to one embodiment described herein.

FIG. 9 shows the reactor lid assembly 20 coupled to or with the wafer carrier track 30. O-rings may be used to seal the reactor lid assembly 20 and wafer carrier track 30 interfaces. As shown, the entrance into the CVD reactor 10 may be sized to receive varying sizes of wafers. In one embodiment, a gap 60, formed between the raised portions 26 of the reactor lid assembly 20 and the guide path of the wafer carrier track 30, in which the wafer is received, is dimensioned to help prevent contaminants from entering the CVD reactor 10 at either end, dimensioned to help prevent back diffusion of gases between zones, and dimensioned to help ensure that the gases supplied to the wafer during the CVD process are uniformly distributed across the thickness of the gap and across the wafer. In one embodiment, the gap 60 may be formed between the lower surface of the reactor lid assembly 20 and the guide path of the wafer carrier track 30, In one embodiment, the gap 60 may be formed between the lower surface of the gas manifold assemblies and the guide path of the wafer carrier track 30, In one embodiment, the gap 60 may be in the range of about 0.5 millimeters to about 5 millimeters in thickness and may vary along the length of the reactor lid assembly 20 and wafer carrier track 30. In one embodiment, the wafer may have a length in the range of about 50 millimeters to about 150 millimeters, a width in the range of about 50 millimeters to about 150 millimeters, and a thickness in the range of about 0.5 millimeters to about 5 millimeters. In one embodiment, the wafer may include a base layer having individual strips of layers disposed on the base layer. The individual strips are treated in the CVD process. These individual strips may have a length of about 10 cm and a width of about 1 cm (although other sizes may be utilized as well), and may be formed in this manner to facilitate removal of the treated strips from the wafer and to reduce the stresses induced upon the treated strips during the CVD process. The CVD reactor 10 may be adapted to receive wafers having dimensions that extend beyond the above recited ranges for different applications.

The CVD reactor 10 may be adapted to provide an automatic and continuous feed and exit of wafers into and out of the reactor, such as with a conveyor-type system. A wafer may be fed into the CVD reactor 10 at one end of the reactor, by a conveyor for example, communicated through a CVD process, and removed at the opposite end of the reactor, by a retriever for example, using a manual and/or automated system. The CVD reactor 10 may be adapted to produce wafers in the range of one wafer about every 10 minutes to one wafer about every 10 seconds, and may extend beyond this range for different applications. In one embodiment, the CVD reactor 10 may be adapted to produce 6-10 treated wafers per minute.

Figure 10A:
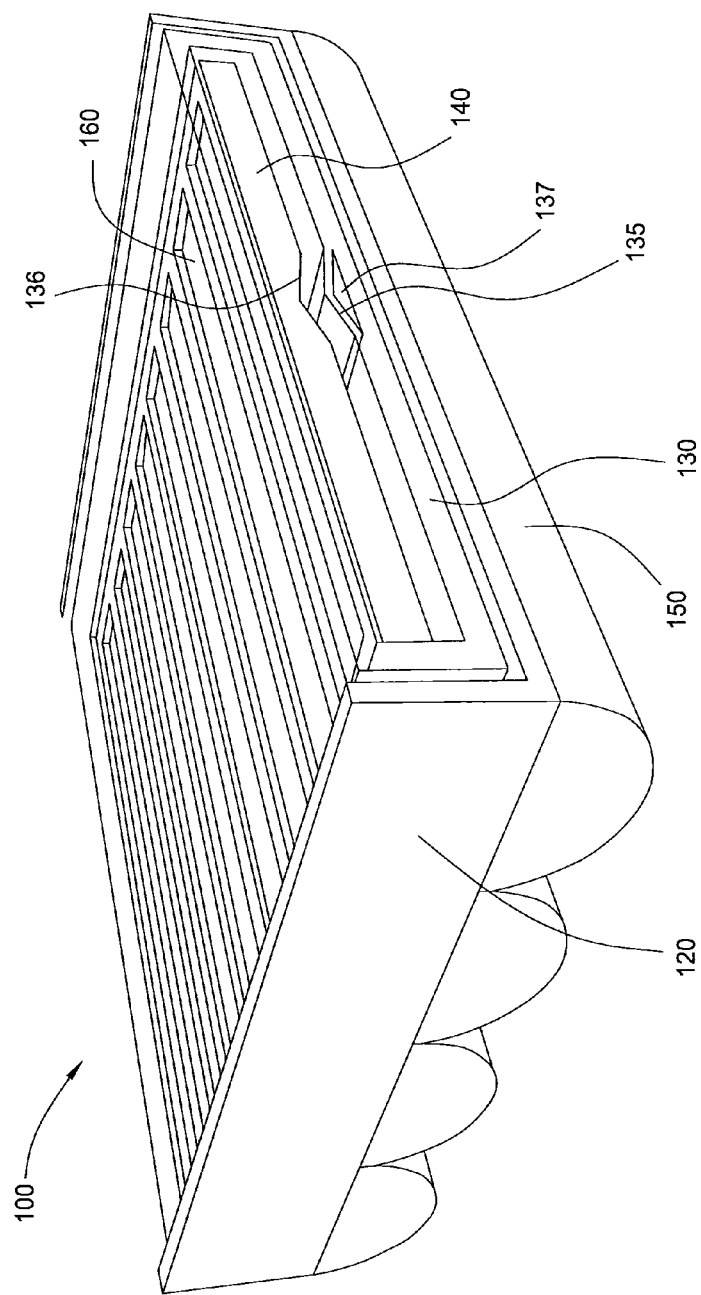
FIG. 10A depicts a CVD reactor according to one embodiment described herein.

FIG. 10A shows an alternative embodiment of a CVD reactor 100. The CVD reactor 100 includes a reactor body 120, a wafer carrier track 130, a wafer carrier 140, and a heating lamp assembly 150. The reactor body 120 may form a rectangular body and may be contain molybdenum, quartz, stainless steel, or other similar material. The reactor body 120 may enclose the wafer carrier track 130 and extend substantially the length of the wafer carrier track 130. The wafer carrier track 130 may also form a rectangular body and may contain quartz or other low thermal conductive material to assist with temperature distribution during the CVD process. The wafer carrier track 130 may be configured to provide a levitation-type system that supplies a cushion of gas to communicate a wafer along the wafer carrier track 130. As shown, a conduit, such as a gas cavity 137 having a v-shaped roof 135 is centrally located along the longitudinal axis of the guide path of the wafer carrier track 130. Gas is supplied through gas cavity 137 and is injected through gas holes in the roof 135 to supply the cushion of gas that floats a wafer having a corresponding v-shaped notch (not shown) on its bottom surface along the wafer carrier track 130. In one embodiment, the reactor body 120 and the wafer carrier track 130 each are a single structural component. In an alternative embodiment, the reactor body 120 includes multiple segments coupled together to form a complete structural component. In an alternative embodiment, the wafer carrier track 130 includes multiple segments coupled together to form a complete structural component.

Also shown in FIG. 10A is a wafer carrier 140 adapted to carry a single wafer (not shown) or strips 160 of a wafer along the wafer carrier track 130. The wafer carrier 140 may be formed from graphite or other similar material. In one embodiment, the wafer carrier 140 may have a v-shaped notch 136 along its bottom surface to correspond with the v-shaped roof 135 of the wafer carrier track 130. The v-shaped notch 136 disposed over the v-shaped roof 135 helps guide the wafer carrier 140 along the wafer carrier track 130. The wafer carrier 140 may be used to carry the wafer strips 160 through the CVD process to help reduce the thermal stresses imparted on the wafer during the process. Gas holes in the roof 135 of the gas cavity 137 may direct a cushion of gas along the bottom of the wafer carrier 140, which utilizes the corresponding v-shaped feature to help stabilize and center the wafer carrier 140, and thus the strips 160 of wafer, during the CVD process. As stated above, a wafer may be provided in strips 160 to facilitate removal of the treated strips from the wafer carrier 140 and to reduce the stresses induced upon the strips during the CVD process.

In another embodiment, FIGS. 10B-10F depict a wafer carrier 70 which may be used to carry a wafer through a variety of processing chambers including the CVD reactors as described herein, as well as other processing chambers used for deposition or etching. The wafer carrier 70 has short sides 71, long sides 73, an upper surface 72, and a lower surface 74. The wafer carrier 70 is illustrated with a rectangular geometry, but may also have a square geometry, a circular geometry, or other geometries. The wafer carrier 70 may contain or be formed from graphite or other materials. The wafer carrier 70 usually travels through the CVD reactor with the short sides 71 facing forward while the long sides 73 face towards the sides of the CVD reactor.

Figure 10B:
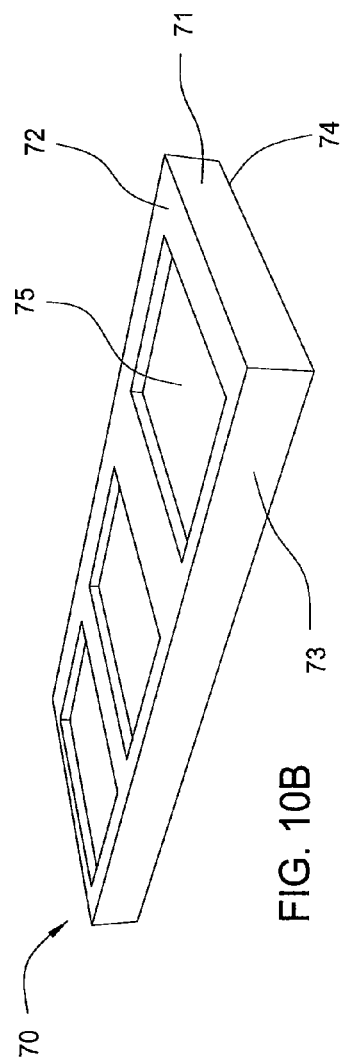
FIGS. 10B-10C depict a levitating wafer carrier according to another embodiment described herein.

FIG. 10B illustrates a top view of the wafer carrier 70 containing 3 indentations 75 on the upper surface 72. Wafers may be positioned within the indentations 75 while being transferred through the CVD reactor during a process. Although illustrated with 3 indentations 75, the upper surface 72 may have more or less indentations, including no indentations. For example, the upper surface 72 of the wafer carrier 70 may contain 0, 1, 2, 3, 4, 5, 6, 7, 8, 9, 10, 12, or more indentations for containing wafers. In some example, one or multiple wafers may be disposed directly on the upper surface 72 which does not have an indentation.

Figure 10C:
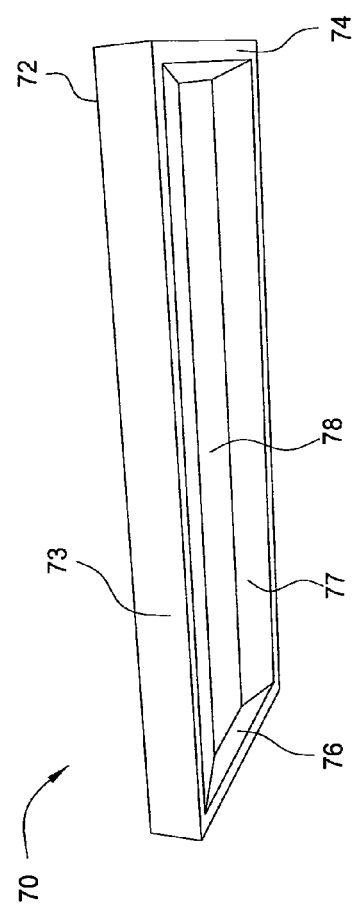

FIG. 10C illustrates a bottom view of the wafer carrier 70 containing the indentation 78 on the lower surface 74, as described in one embodiment herein. The indentation 78 may be used to help levitate the wafer carrier 70 upon the introduction of a gas cushion under the wafer carrier 70. A gas flow may be directed at the indentation 78, which accumulates gas to form the gas cushion. The lower surface 74 of the wafer carrier 70 may have no indentations, or may have one indentation 78 (FIG. 10C), two indentations 78 (FIGS. 10D-10F), three indentations 78 (not shown) or more. The indentation 78 may have straight or tapered sides. In one example, the indentation 78 has tapered sides such that the sides 76 are steeper or more abrupt than the sides 77 which have more of a gradual change of angle. The sides 77 within the indentation 78 may be tapered to compensate for a thermal gradient across the wafer carrier 70. In another example, the indentation 78 has straight sides and tapered sides such that the sides 76 are straight and the sides 77 have a taper or the sides 77 are straight and the sides 76 have a taper. Alternatively, the indentation 78 may have all straight sides such that the sides 76 and 77 are straight.

Figure 10F:
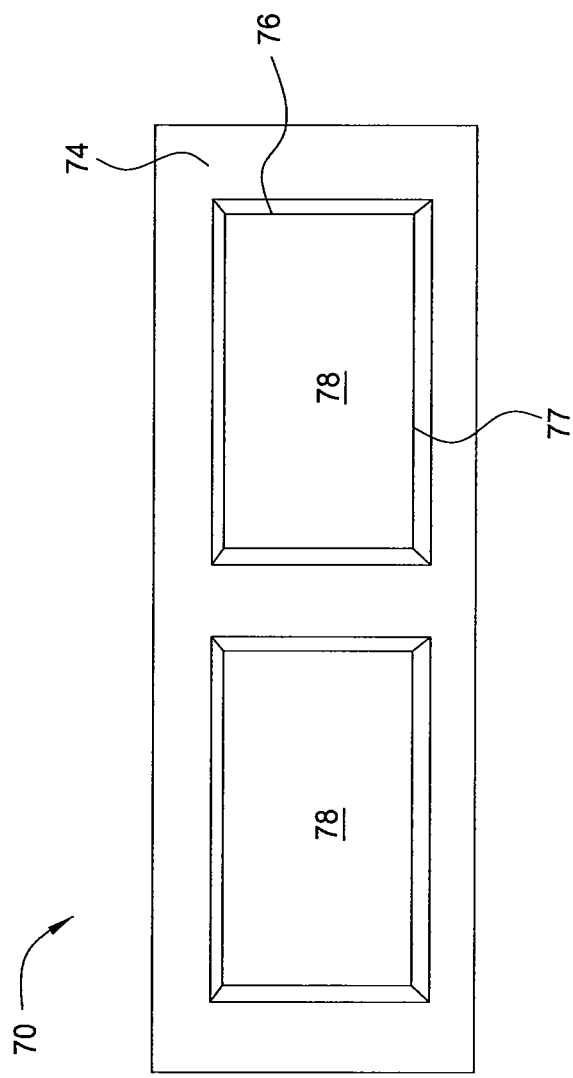

In another embodiment, FIGS. 10D-10F illustrate bottom views of the wafer carrier 70 containing two indentations 78 on the lower surface 74. The two indentations 78 help levitate the wafer carrier 70 upon the introduction of a gas cushion under the wafer carrier 70. A gas flow may be directed at the indentations 78, which accumulates gas to form the gas cushion. The indentations 78 may have straight or tapered sides. In one example, as illustrated in FIG. 10E, the indentations 78 have all straight sides such that the sides 76 and 77 are straight, e.g., perpendicular to the plane of the lower surface 74. In another example, as illustrated in FIG. 10F, the indentations 78 have all tapered sides such that the sides 76 are steeper or more abrupt than the sides 77 which have more of a gradual change of angle. The sides 77 within the indentations 78 may be tapered to compensate for a thermal gradient across the wafer carrier 70. Alternatively, the indentations 78 may have a combination of straight sides and tapered sides such that the sides 76 are straight and the sides 77 have a taper or the sides 77 are straight and the sides 76 have a taper.

The wafer carrier 70 contains a heat flux which extends from the lower surface 74 to the upper surface 72 and to any wafers disposed thereon. The heat flux may be controlled by both the internal pressure and length of the processing system. The profile of wafer carrier 70 may be tapered to compensate the heat loses from other sources. During a process, heat is lost through the edges of the wafer carrier 70, such as the short sides 71 and the long sides 73. However, the heat lost may be compensated by allowing more heat flux into the edges of the wafer carrier 70 by reducing the gap of the guide path in the levitation.

FIG. 10A also depicts the reactor body 120 disposed on the heating lamp assembly 150. The heating lamp assembly 150 may be configured to control the temperature profile within the CVD reactor by increasing and decreasing the temperature of the reactor body 120, the wafer carrier track 130, and specifically the wafer, along the length of the CVD reactor. The heating lamp assembly 150 may include a plurality of heating lamps disposed along the longitudinal length of the wafer carrier track 130. In one embodiment, the heating lamp assembly 150 includes individually controlled heating lamps disposed along the length of the wafer carrier track 130. In an alternative embodiment, the heating lamp assembly 150 includes a bank of heating lamps that are movable and follow a wafer as it travels along the wafer carrier track 130. The embodiments of the heating lamp assembly 150 may also be used as the heating lamp assembly 50, described above with respect to FIG. 1.

In an alternative embodiment, other types of heating assemblies (not shown) may be utilized to heat the reactor body 120 instead of the heating lamp assembly 150. In one embodiment, a heating assembly may include resistive heating elements, such as resistive heaters, which may be individually controlled along the length of the wafer carrier track 130. In one example, a resistive heating element may be bonded to or painted onto the reactor body 120, the wafer carrier track 130, or the wafer carrier 140. In alternative embodiment, another type of heating assembly that may be utilized to heat the reactor body 120 is an inductive heating element, such as with a radio frequency power source (not shown). The inductive heating element may be coupled to or with the reactor body 120, the wafer carrier track 130, and/or the wafer carrier 140. Embodiments of the various types of heating assemblies (including heating lamp assemblies 50 and 150) described herein may be utilized independently or in combination with the CVD reactor.

In one embodiment, the heating lamp assembly 150 may be configured to heat a wafer in the CVD reactor to a temperature within a range from about 300° C. to about 800° C. In one embodiment, the heating lamp assembly 150 may be configured to raise the temperature of the wafer to an appropriate process temperature prior to introduction into a deposition zone of the CVD reactor. In one embodiment, the heating lamp assembly 150 may be configured with the CVD reactor to bring the wafer to a temperature within a range from about 300° C. to about 800° C. prior to introduction into a deposition zone of the CVD reactor. In one embodiment, the wafer may be heated to within a process temperature range prior to entering one or more deposition zones of the CVD reactor to facilitate the deposition processes, and the temperature of the wafer may be maintained within the process temperature range as the wafer passes through the one or more deposition zones. The wafer may be heated to and maintained within the process temperature range as it moves along the wafer carrier track. A center temperature to an edge temperature of the wafer may be within 10° C. of each other.

Figure 11:
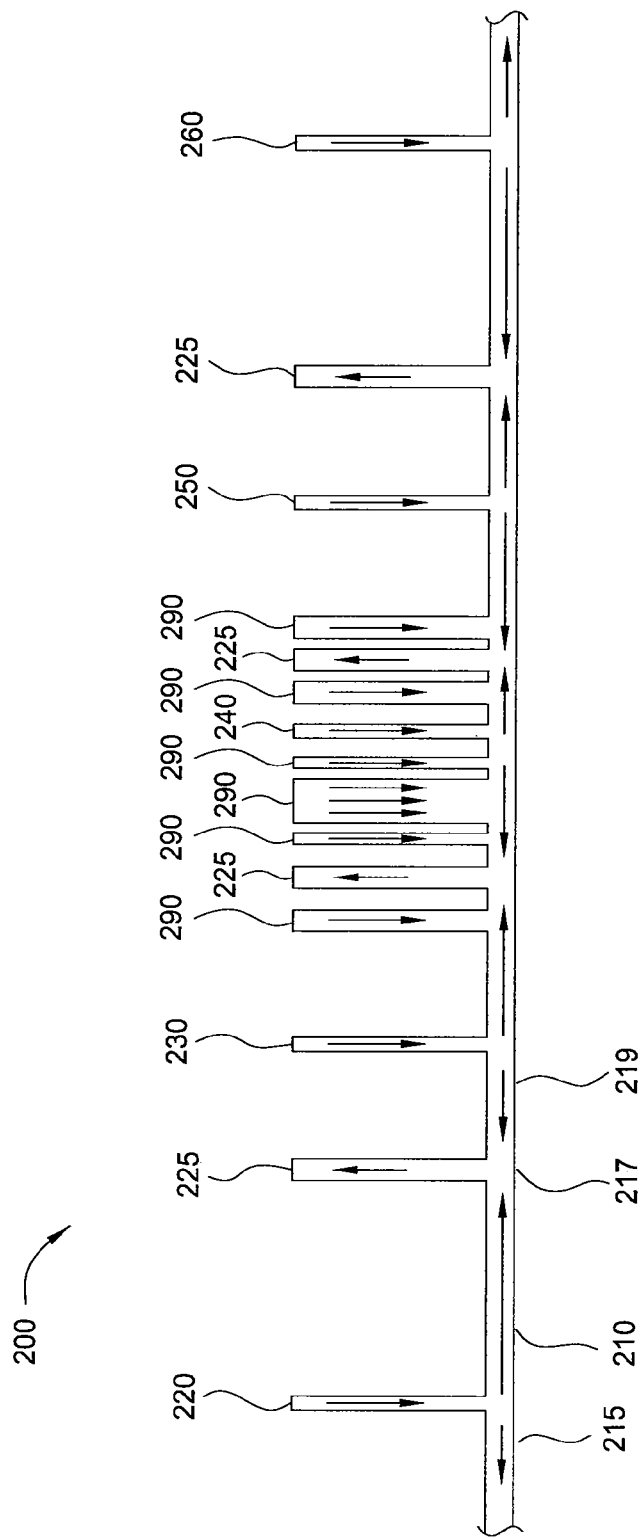
FIG. 11 depicts a first layout of the CVD reactor according to one embodiment described herein.

FIGS. 11-17 illustrate various configurations of CVD processes that can be utilized with the CVD reactor as described herein. FIG. 11 illustrates a first configuration 200, having an entrance isolator assembly 220, a first isolator assembly 230, a second isolator assembly 240, a third isolator assembly 250, and an exit isolator assembly 260. A plurality of deposition zones 290 may be located along the wafer carrier track of the CVD reactor and may be surrounded by the isolator assemblies. Between each of these isolator assemblies, one or more exhausts 225 may be provided to remove any gases that are supplied to the wafer at each isolator assembly or deposition zone. As shown, a precursor gas may be injected at the entrance isolator assembly 220, which follows a two dimensional flow path, e.g. down to the wafer and then along the length of the wafer carrier track, indicated by flow path 210 for example. The gas is then exhausted up through exhaust 225, which may be provided on each side of the isolator assembly 220. The gas may be directed at the entrance isolator assembly 220 and then along the length of the wafer carrier track, indicated by flow path 215 for example, to prevent contaminants from entering the entrance of the CVD reactor. Gas injected at the intermediate isolator assemblies, such as isolator assembly 230, or at the deposition zones 290, may travel upstream from the flow of the wafer, indicated by flow path 219 for example. This back diffusion of gas may be received through the adjacent exhaust to prevent contaminants or mixing of gases between zones along the wafer carrier track of the CVD reactor. In addition, the flow rate of the gases injected through the isolator assemblies, e.g. along flow path 210, in the direction of the wafer flow may also be adapted to further prevent back diffusion from entering the isolation zone. The laminar flow along flow path 210 may be flowed at different flow rates to meet any back diffusion of gas, for example at junction 217 below exhaust 225, to prevent the back diffusion of gas from isolator assembly 230 from entering the isolation zone developed by isolator assembly 220. In one embodiment, the wafer may be heated to within a process temperature range as it travels along the wafer carrier track prior to entering the deposition zones 290. The temperature of the wafer may be maintained within the process temperature range as it travels along the wafer carrier track through the deposition zones 290. The wafer may be cooled to within a specific temperature range upon exiting the deposition zones 290 as it travels along the remainder of the wafer carrier track.

The lengths of the isolation zones and the deposition zones may be varied to reduce the effects of back diffusion of gases. In one embodiment, the lengths of the isolation zones created may range from about 1 meter to about 2 meters in length but may extend beyond this range for different applications.

The flow rates of the gases injected from the isolator assemblies may also be varied to reduce the effects of back diffusion of gases. In one embodiment, the entrance isolator assembly 220 and the exit isolator assembly 260 may supply a precursor gas at about 30 liters per minute, while the first 230, second 240, and third 250 isolator assemblies may supply a precursor gas at about 3 liters per minute. In one embodiment, the precursor gas supplied at the entrance isolator assembly 220 and the exit isolator assembly 260 may include nitrogen. In one embodiment, the precursor gas supplied at the first 230, second 240, and third 250 isolator assemblies may include arsine. In one embodiment, two isolator assemblies may supply a total of about 6 liters per minute of nitrogen. In one embodiment, three isolator assemblies may supply a total of about 9 liters per minute of arsine.

The gap, e.g. the thickness between the guide path of the wafer carrier track and the raised portion of the reactor lid assembly, alternatively, the thickness of the space through which wafer travels into and out of the CVD reactor, of the isolation zones may also be varied to reduce the effects of back diffusion of gases. In one embodiment, the isolator gap may be in a range of about 0.1 millimeters to about 5 millimeters.

Figure 18:
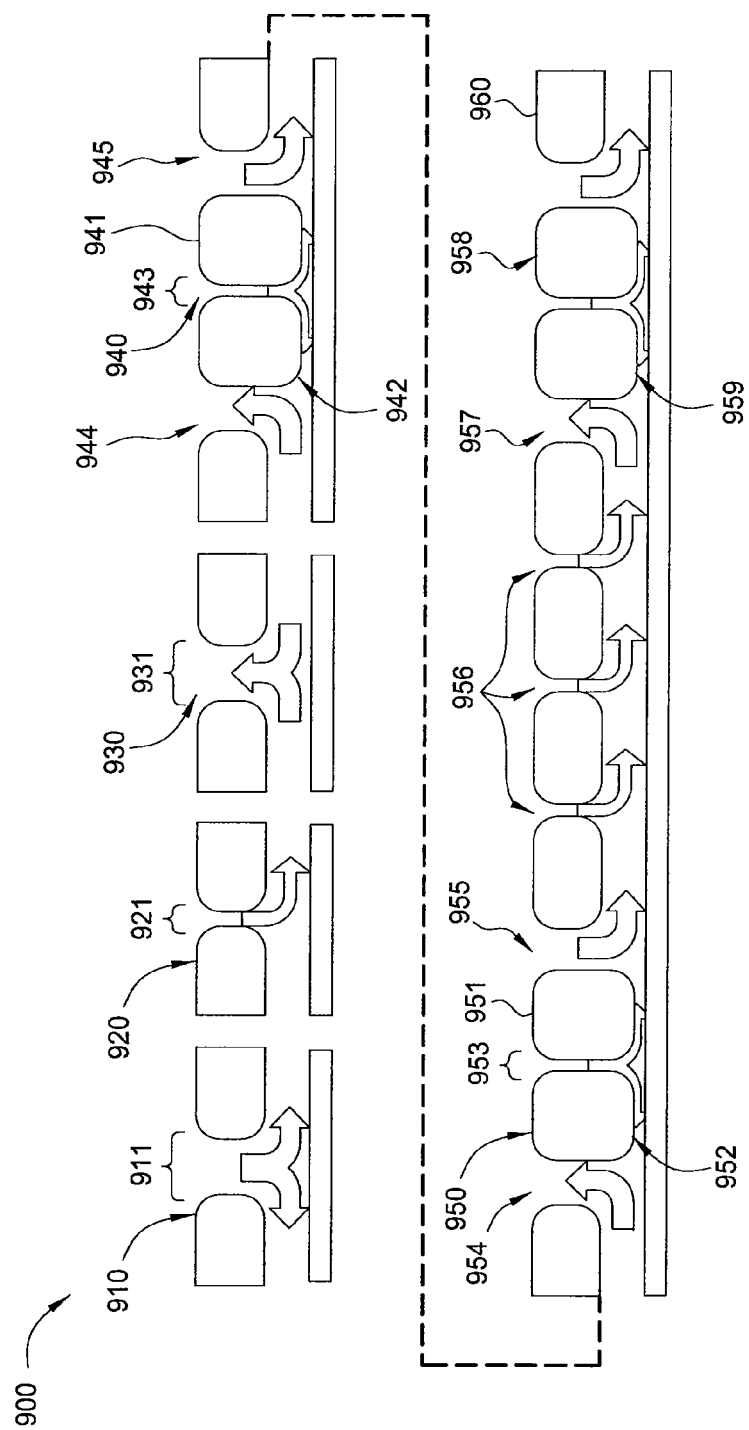
FIG. 18 depicts flow path configurations of the CVD reactor according to one embodiment described herein.

FIG. 18 illustrates several flow path configurations 900 which may be provided by the CVD reactor. The flow path configurations 900 may be used for injecting a gas through one or more isolator assemblies, injecting a gas into a deposition zone, and/or exhausting a gas from isolation and/or deposition zones. Dual flow path configuration 910 shows a gas directed in the same direction as the flow path of the wafer, as well as in the opposite direction of the flow path of the wafer. In addition, a larger volume of flow may be directed through the dual flow path configuration 910 due to the wider flow area 911. This wider flow area 911 may be adapted for use with the other embodiments described herein. Single flow path configuration 920 shows a gas directed in a single direction, which may be in the same or opposite direction of the flow path of the wafer. In addition, a low volume of flow may be directed through the single flow path configuration 920 due to the narrow flow area 921. This narrower flow area 921 may be adapted for use with the other embodiments described herein. Exhaust flow path configuration 930 shows that gas may be exhausted from adjacent zones through a wider flow area 931, such as adjacent isolation zones, adjacent deposition zones, or an isolation zone adjacent to a deposition zone.

In one embodiment, first exhaust/injector flow path configuration 940 shows a dual flow path configuration 941 having a narrow flow area 943 disposed between an exhaust flow path 944 and a single injection flow path 945. Also shown is a narrower gap 942 portion along which the wafer may travel through the CVD reactor. As described above, the gap 942 may vary along the wafer carrier track of the CVD reactor, thereby allowing a gas to be directly and uniformly injected onto the surface of the wafer. This narrower gap 942 portion may be used to provide full consumption or near full consumption of the gas injected onto the wafer during a reaction in a deposition zone. In addition, the gap 942 may be used to facilitate thermal control during the isolation and/or deposition process. A gas injected in the narrower gap 942 portion may maintain a higher temperature as it is injected onto the wafer.

In one embodiment, a second exhaust/injector flow path configuration 950 provides a first exhaust flow path 954 having a wide flow area, a first dual flow path configuration 951 having a narrow gap portion 952 and flow area 953, a first single injection flow path 955 having a wide flow area, a plurality of single injection flow paths 956 having narrow flow areas a wide gap portion, a second exhaust flow path 957 having a wide flow area, a second dual flow path configuration 958 having a narrow gap portion 959 and flow area, and a second single injection flow path 960 having a wide flow area and gap portion.

In one embodiment, the gas injected through the isolator assemblies may be directed in the same direction as the flow path of the wafer. In an alternative embodiment, the gas injected through the isolator assemblies may be directed in the opposite direction as the flow path of the wafer. In an alternative embodiment, the gas injected through the isolator assemblies may be directed in both the same and opposite direction as the flow path of the wafer. In an alternative embodiment, the isolator assemblies may direct gas in different directions depending on their location in the CVD reactor.

In one embodiment, the gas injected into the deposition zones may be directed in the same direction as the flow path of the wafer. In an alternative embodiment, the gas injected into the deposition zones may be directed in the opposite direction as the flow path of the wafer. In an alternative embodiment, the gas injected into the deposition zones may be directed in both the same and opposite direction as the flow path of the wafer. In an alternative embodiment, gas may be directed in different directions depending on the location of the deposition zone in the CVD reactor.

Figure 12:
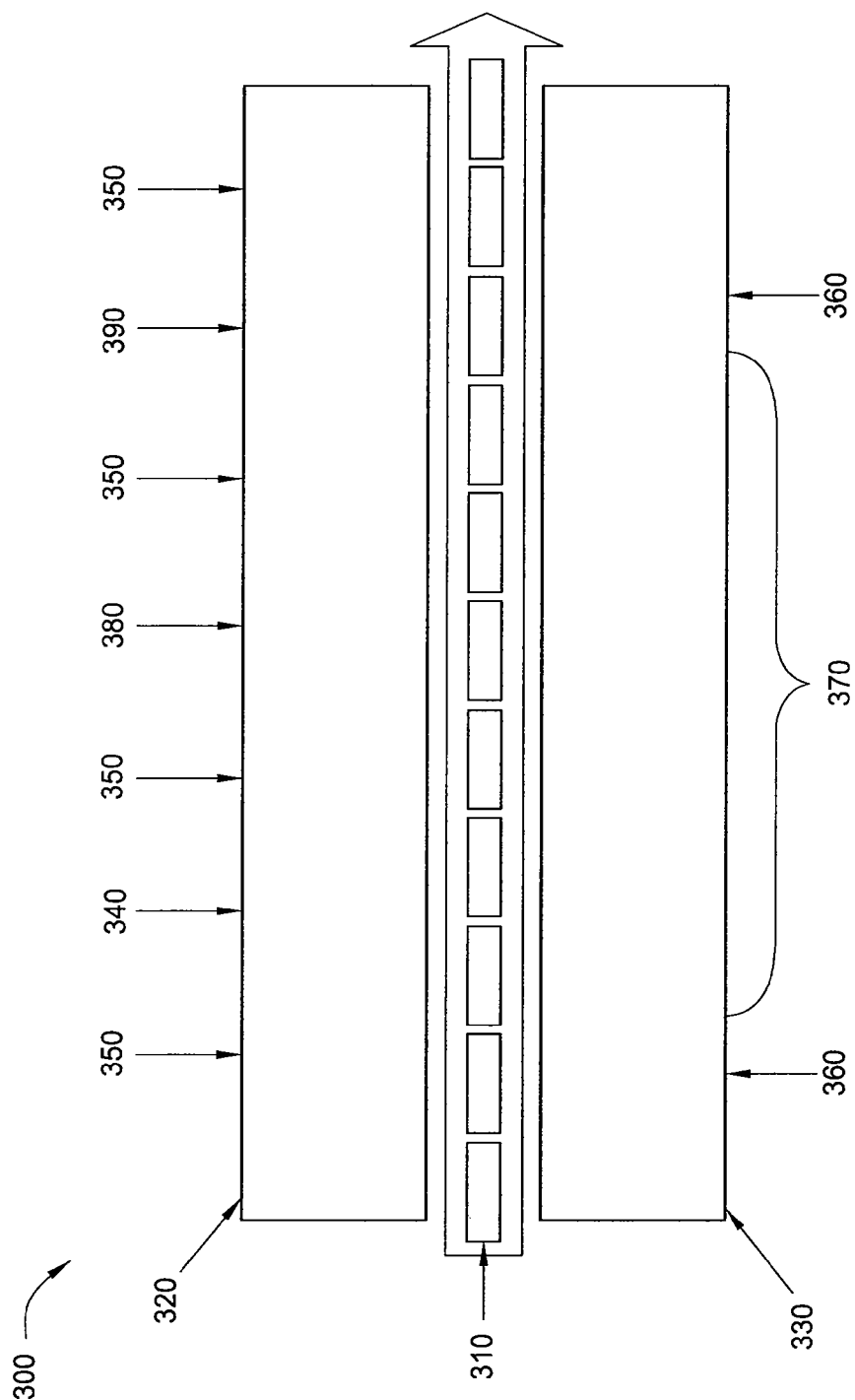
FIG. 12 depicts a second layout of the CVD reactor according to one embodiment described herein.

FIG. 12 illustrates a second configuration 300. The wafer (s) 310 is introduced into the entrance of the CVD reactor and travels along the wafer carrier track of the reactor. The reactor lid assembly 320 provides several gas isolation curtains 350 located at the entrance and the exit of the CVD reactor, as well as between deposition zones 340, 380, 390 to prevent contamination and mixing of the gases between deposition and isolation zones. The gas isolation curtains and deposition zones may be provided by one or more gas manifold assemblies of the reactor lid assembly 320. These deposition zones include an aluminum arsenide deposition zone 340, a gallium arsenide deposition zone 380, and a phosphorous gallium arsenide deposition zone 390, thereby forming a multiple layer epitaxial deposition process and structure. As the wafer (s) 310 travels along the bottom portion 330 of the reactor, which may generally include the wafer carrier track and the heating lamp assembly, the wafer 310 may be subjected to temperature ramps 360 at the entrance and exit of the reactor to incrementally increase and decrease the temperature of the wafer, prior to entering and upon exiting the deposition zones 340, 380, 390, to reduce thermal stress imparted on the wafer 310. The wafer 310 may be heated to within a process temperature range prior to entering the deposition zones 340, 380, 390 to facilitate the deposition processes. As the wafer 310 travels through the deposition zones 340, 380, 390 the temperature of the wafer may be maintained within a thermal region 370 to assist with the deposition processes. The wafer (s) 310 may be provided on a conveyorized system to continuously feed and receive wafers into and out of the CVD reactor.

Figure 13:
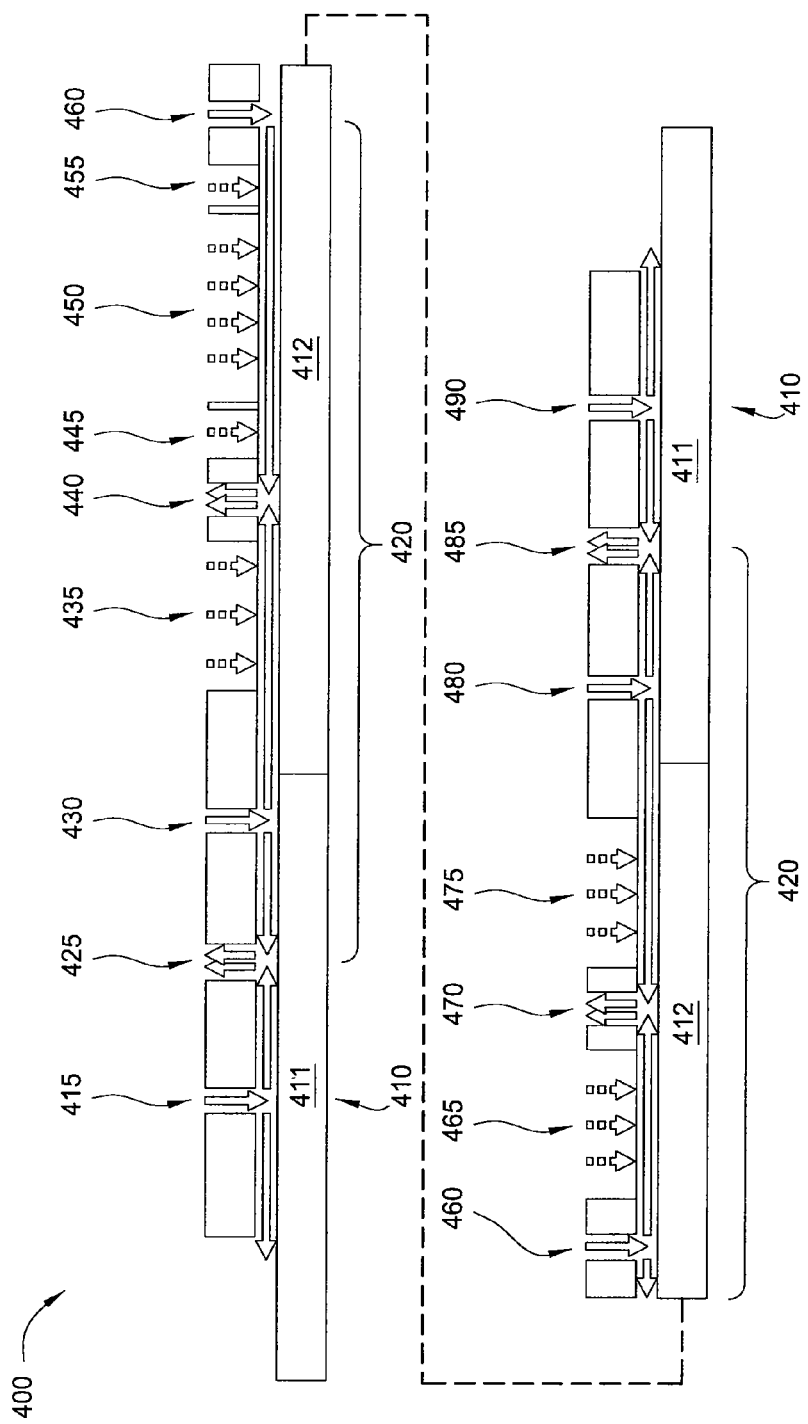
FIG. 13 depicts a third layout of the CVD reactor according to one embodiment described herein.

FIG. 13 illustrates a third configuration 400. The CVD reactor may be configured to supply nitrogen 410 to the reactor to float the wafer(s) along the wafer carrier track of the reactor at the entrance and the exit. A hydrogen/arsine mixture 420 may also be used to float the wafer along the wafer carrier track of the CVD reactor between the exit and entrance. The stages of the third configuration 400 may be provided by one or more gas manifold assemblies of the reactor lid assembly. The stages along the wafer carrier track may include an entrance nitrogen isolation zone 415, a preheat exhaust zone 425, a hydrogen/arsine mixture preheat isolation zone 430, a gallium arsenide deposition zone 435, a gallium arsenide exhaust 440, an aluminum gallium arsenide deposition zone 445, a gallium arsenide N-layer deposition zone 450, a gallium arsenide P-layer deposition zone 455, a phosphorous hydrogen arsine isolation zone 460, a first phosphorous aluminum gallium arsenide deposition zone 465, a phosphorous aluminum gallium arsenide exhaust zone 470, a second phosphorous aluminum gallium arsenide deposition zone 475, a hydrogen/arsine mixture cool down isolation zone 480, a cool down exhaust zone 485, and an exit nitrogen isolation zone 490. As the wafer travels along the bottom portion of the reactor, which may generally include the wafer carrier track and the heating lamp assembly, the wafer may be subjected to one or more temperature ramps 411 at the entrance and exit of the reactor to incrementally increase and decrease the temperature of the wafer, prior to entering and upon exiting the deposition zones 435, 445, 450, 455, 465, 475 to reduce thermal stress imparted on the wafer. The wafer may be heated to within a process temperature range prior to entering the deposition zones 435, 445, 450, 455, 465, 475 to facilitate the deposition processes. As the wafer travels through the deposition zones 435, 445, 450, 455, 465, 475 the temperature of the wafer may be maintained within a thermal region 412 to assist with the deposition processes. As shown, the temperature of the wafer traveling through the third configuration 400 may be increased as it passes the entrance isolation zone 415, may be maintained as is travels through the zones 430, 435, 440, 445, 450, 455, 460, 465, 470, 475, and may be decreased as it nears the hydrogen/arsine mixture cool down isolation zone 480 and travels along the remainder of the wafer carrier track.

Figure 14:
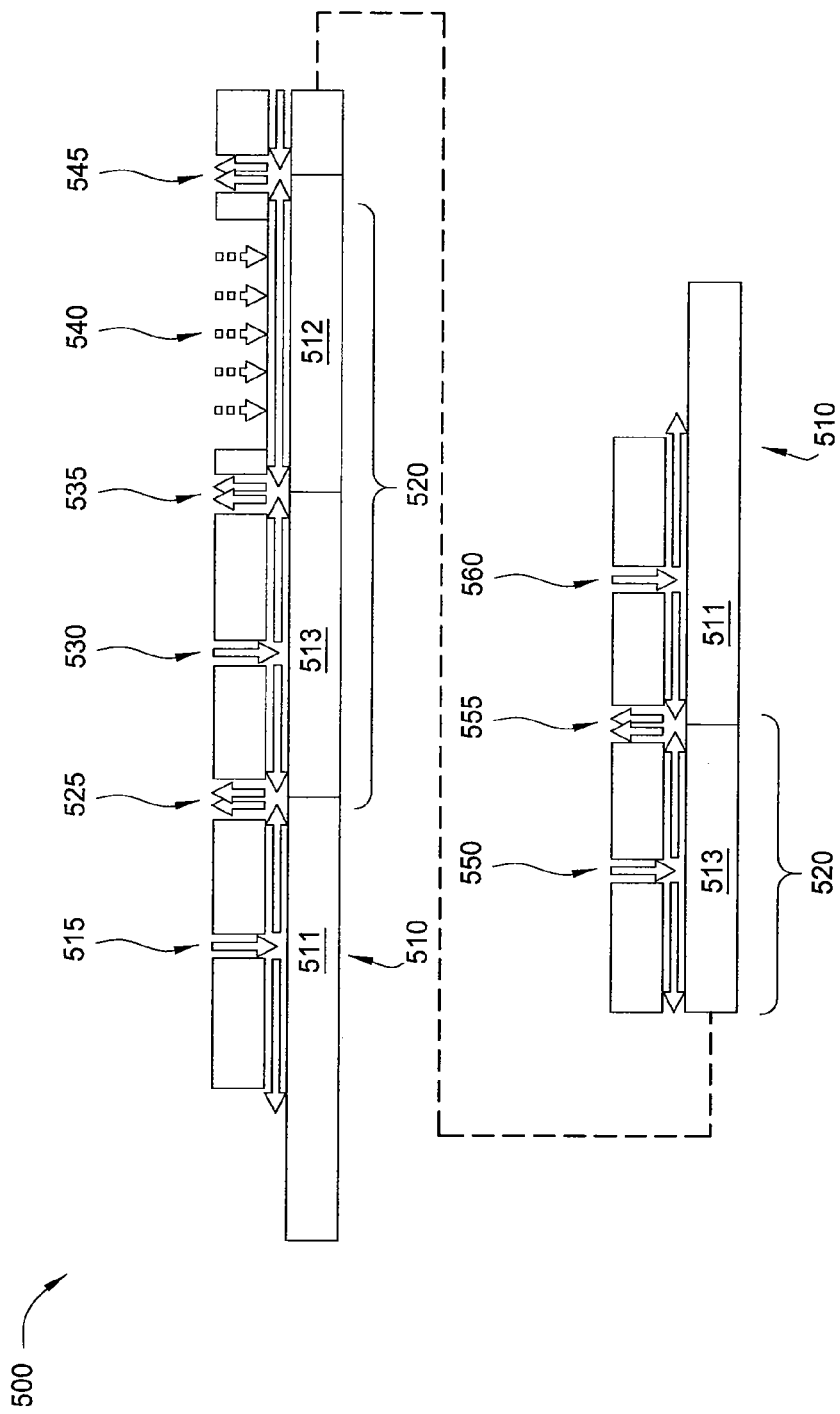
FIG. 14 depicts a fourth layout of the CVD reactor according to one embodiment described herein.

FIG. 14 illustrates a fourth configuration 500. The CVD reactor may be configured to supply nitrogen 510 to the reactor to float the wafer(s) along the wafer carrier track of the reactor at the entrance and the exit. A hydrogen/arsine mixture 520 may also be used to float the wafer along the wafer carrier track of the CVD reactor between the exit and entrance. The stages of the fourth configuration 500 may be provided by one or more gas manifold assemblies of the reactor lid assembly. The stages along the wafer carrier track may include an entrance nitrogen isolation zone 515, a preheat exhaust zone 525, a hydrogen/arsine mixture preheat isolation zone 530, an exhaust zone 535, a deposition zone 540, an exhaust zone 545, a hydrogen/arsine mixture cool down isolation zone 550, a cool down exhaust zone 555, and an exit nitrogen isolation zone 545. In one embodiment, the deposition zone 540 may include an oscillating showerhead assembly. As the wafer travels along the bottom portion of the reactor, which may generally include the wafer carrier track and the heating lamp assembly, the wafer may be subjected to one or more temperature ramps 511, 513 at the entrance and exit of the reactor to incrementally increase and decrease the temperature of the wafer, prior to entering and upon exiting the deposition zone 540 to reduce thermal stress imparted on the wafer. The wafer may be heated to within a process temperature range prior to entering the deposition zone 540 to facilitate the deposition process. In one embodiment, the wafer may be heated and/or cooled to within a first temperature range as it travels through the temperature ramps 511. In one embodiment, the wafer may be heated and/or cooled to within a second temperature range as it travels through the temperature ramps 513. The first temperature range may be greater than, less than, and/or equal to the second temperature range. As the wafer travels through the deposition zone 540 the temperature of the wafer may be maintained within a thermal region 512 to assist with the deposition processes. As shown, the temperature of the wafer traveling through the fourth configuration 500 may be increased as it passes the entrance isolation zone 515, may be maintained as is travels through the deposition zone 540, and may be decreased as it nears the hydrogen/arsine mixture cool down isolation zone 550 and travels along the remainder of the wafer carrier track.

Figure 15:
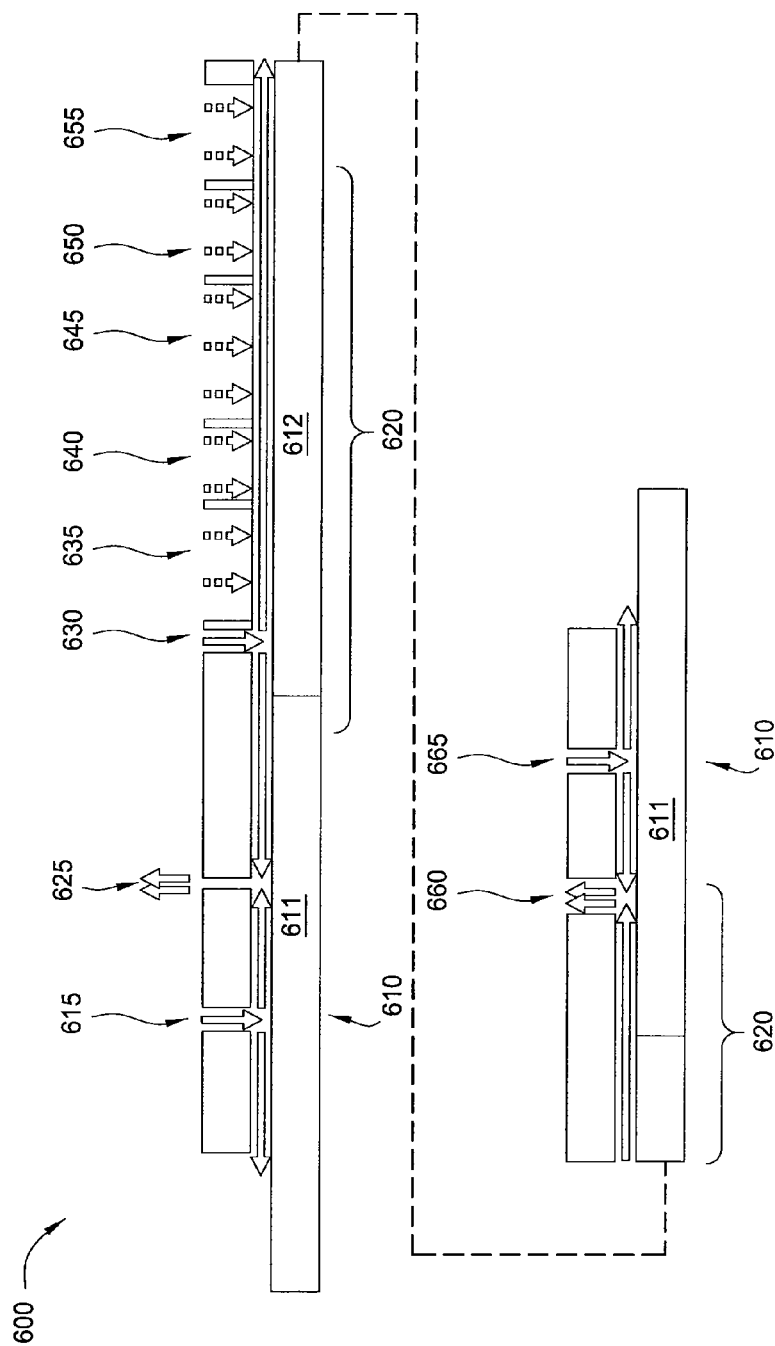
FIG. 15 depicts a fifth layout of the CVD reactor according to one embodiment described herein.

FIG. 15 illustrates a fifth configuration 600. The CVD reactor may be configured to supply nitrogen 610 to the reactor to float the wafer(s) along the wafer carrier track of the reactor at the entrance and the exit. A hydrogen/arsine mixture 620 may also be used to float the wafer along the wafer carrier track of the CVD reactor between the exit and entrance. The stages of the fifth configuration 600 may be provided by one or more gas manifold assemblies of the reactor lid assembly. The stages along the wafer carrier track may include an entrance nitrogen isolation zone 615, a preheat exhaust with flow balance restrictor zone 625, an active hydrogen/arsine mixture isolation zone 630, a gallium arsenide deposition zone 635, an aluminum gallium arsenide deposition zone 640, a gallium arsenide N-layer deposition zone 645, a gallium arsenide P-layer deposition zone 650, a phosphorous aluminum gallium arsenide deposition zone 655, a cool down exhaust zone 660, and an exit nitrogen isolation zone 665. As the wafer travels along the bottom portion of the reactor, which may generally include the wafer carrier track and the heating lamp assembly, the wafer may be subjected to one or more temperature ramps 611 at the entrance and exit of the reactor to incrementally increase and decrease the temperature of the wafer, prior to entering and upon exiting the deposition zones 635, 640, 645, 650, 655 to reduce thermal stress imparted on the wafer. The wafer may be heated to within a process temperature range prior to entering the deposition zones 635, 640, 645, 650, 655 to facilitate the deposition processes. As the wafer travels through the deposition zones 635, 640, 645, 650, 655 the temperature of the wafer may be maintained within a thermal region 612 to assist with the deposition processes. As shown, the temperature of the wafer traveling through the fifth configuration 600 may be increased as is passes the entrance isolation zone 615 and approaches the active hydrogen/arsine mixture isolation zone 630, may be maintained as it travels through the deposition zones 635, 640, 645, 650, 655, and may be decreased as it nears the cool down exhaust zone 660 and travels along the remainder of the wafer carrier track.

Figure 16:
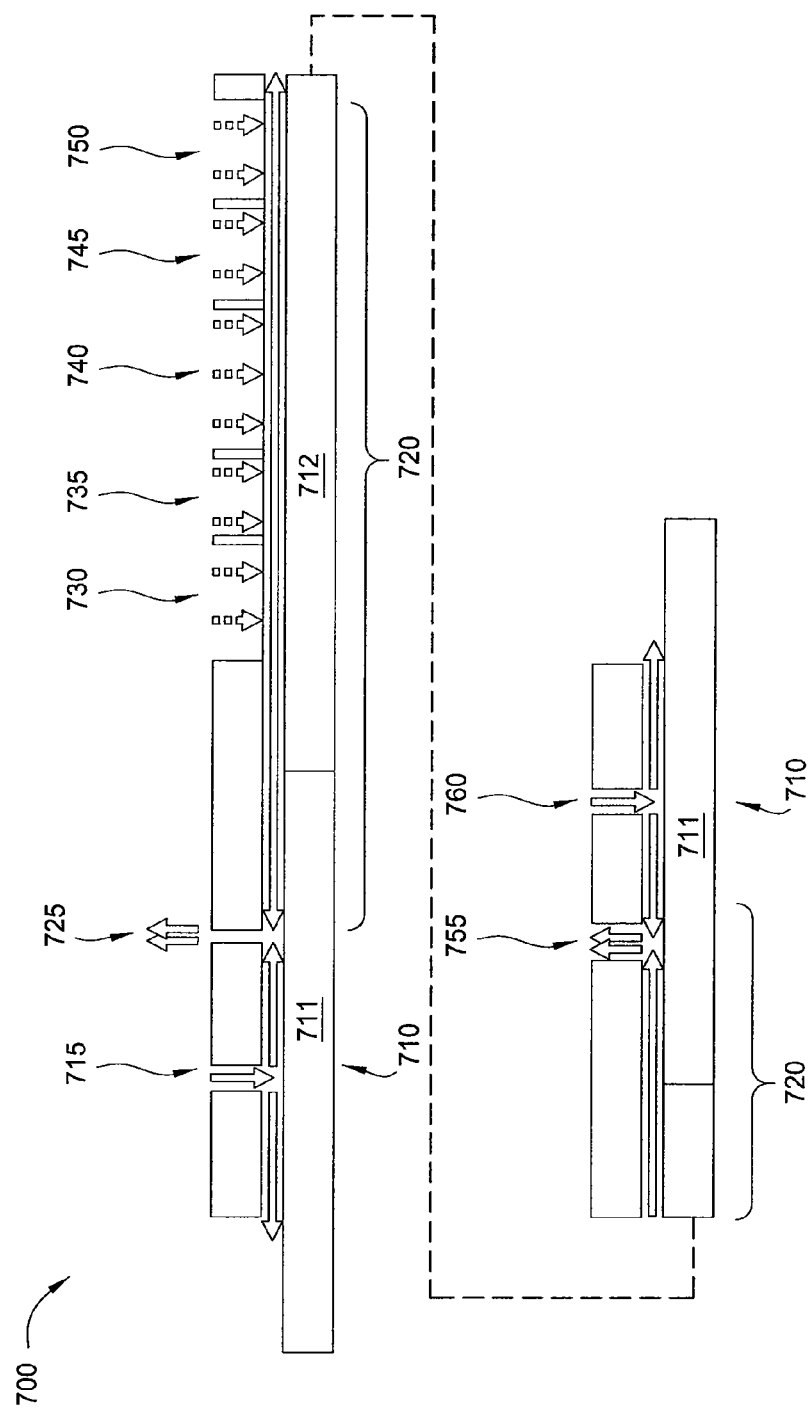
FIG. 16 depicts a sixth layout of the CVD reactor according to one embodiment described herein.

FIG. 16 illustrates a sixth configuration 700. The CVD reactor may be configured to supply nitrogen 710 to the reactor to float the wafer(s) along the wafer carrier track of the reactor at the entrance and the exit. A hydrogen/arsine mixture 720 may also be used to float the wafer along the wafer carrier track of the CVD reactor between the exit and entrance. The stages of the sixth configuration 700 may be provided by one or more gas manifold assemblies of the reactor lid assembly. The stages along the wafer carrier track may include an entrance nitrogen isolation zone 715, a pre-heat exhaust with flow balance restrictor zone 725, a gallium arsenide deposition zone 730, an aluminum gallium arsenide deposition zone 735, a gallium arsenide N-layer deposition zone 740, a gallium arsenide P-layer deposition zone 745, a phosphorous aluminum gallium arsenide deposition zone 750, a cool down exhaust with flow balance restrictor zone 755, and an exit nitrogen isolation zone 760. As the wafer travels along the bottom portion of the reactor, which may generally include the wafer carrier track and the heating lamp assembly, the wafer may be subjected to one or more temperature ramps 711 at the entrance and exit of the reactor to incrementally increase and decrease the temperature of the wafer, prior to entering and upon exiting the deposition zones 730, 735, 740, 745, 750 to reduce thermal stress imparted on the wafer. The wafer may be heated to within a process temperature range prior to entering the deposition zones 730, 735, 740, 745, 750 to facilitate the deposition processes. As the wafer travels through the deposition zones 730, 735, 740, 745, 750 the temperature of the wafer may be maintained within a thermal region 712 to assist with the deposition processes. As shown, the temperature of the wafer traveling through the sixth configuration 700 may be increased as is passes the entrance isolation zone 715 and approaches the gallium arsenide deposition zone 730, may be maintained as it travels through the deposition zones 730, 735, 740, 745, 750, and may be decreased as it nears the cool down exhaust zone 755 and travels along the remainder of the wafer carrier track.

Figure 17:
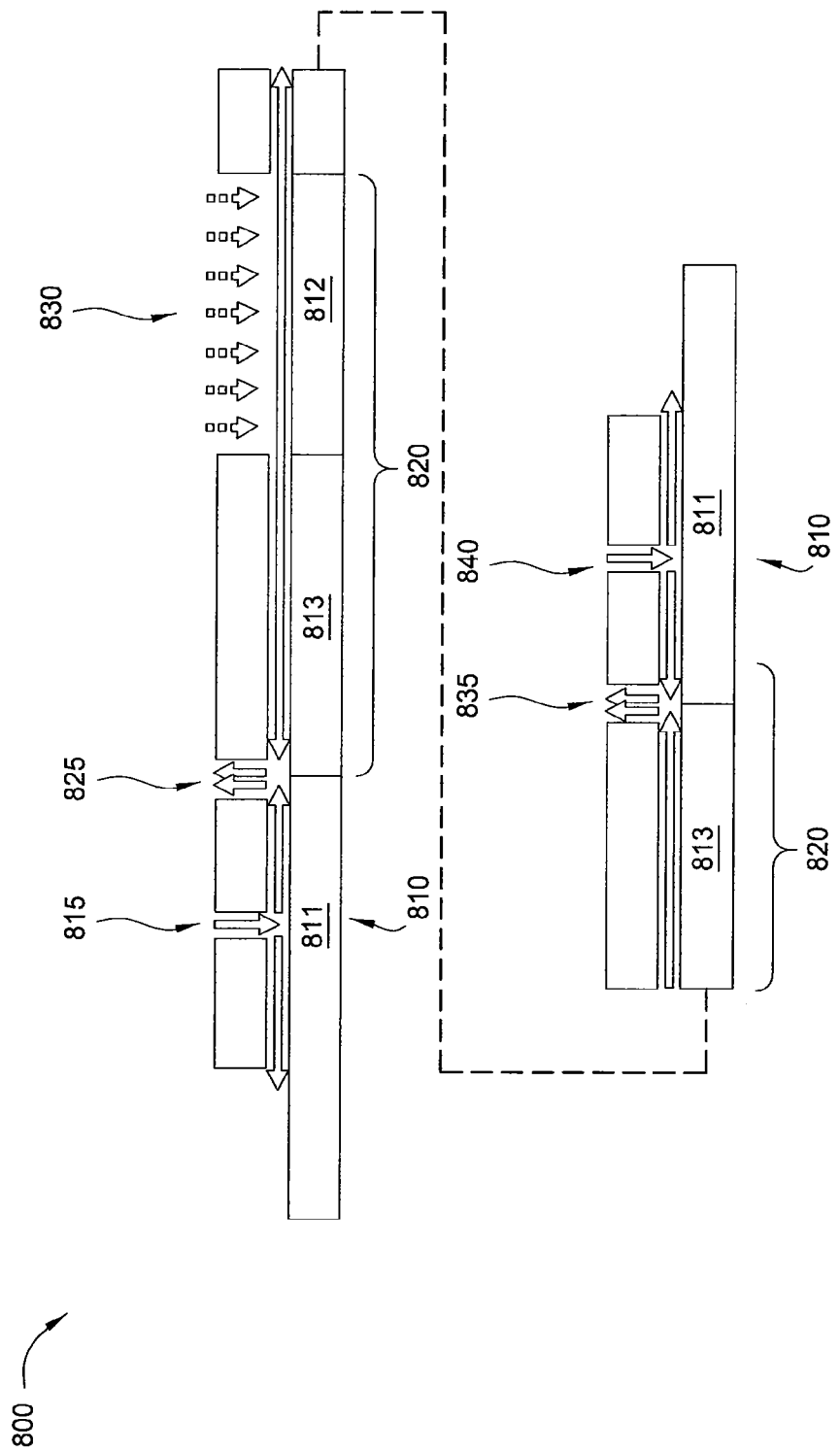
FIG. 17 depicts a seventh layout of the CVD reactor according to one embodiment described herein.

FIG. 17 illustrates a seventh configuration 800. The CVD reactor may be configured to supply nitrogen 810 to the reactor to float the wafer(s) along the wafer carrier track of the reactor at the entrance and the exit. A hydrogen/arsine mixture 820 may also be used to float the wafer along the wafer carrier track of the CVD reactor between the exit and entrance. The stages of the seventh configuration 800 may be provided by one or more gas manifold assemblies of the reactor lid assembly. The stages along the wafer carrier track may include an entrance nitrogen isolation zone 815, a pre-heat exhaust zone 825, a deposition zone 830, a cool down exhaust zone 835, and an exit nitrogen isolation zone 840. In one embodiment, the deposition zone 830 may include an oscillating showerhead assembly. As the wafer travels along the bottom portion of the reactor, which may generally include the wafer carrier track and the heating lamp assembly, the wafer may be subjected to one or more temperature ramps 811, 813 at the entrance and exit of the reactor to incrementally increase and decrease the temperature of the wafer, prior to entering and upon exiting the deposition zone 830 to reduce thermal stress imparted on the wafer. The wafer may be heated to within a process temperature range prior to entering the deposition zone 830 to facilitate the deposition process. In one embodiment, the wafer may be heated and/or cooled to within a first temperature range as it travels through the temperature ramps 811. In one embodiment, the wafer may be heated and/or cooled to within a second temperature range as it travels through the temperature ramps 813. The first temperature range may be greater than, less than, and/or equal to the second temperature range. As the wafer travels through the deposition zone 830 the temperature of the wafer may be maintained within a thermal region 812 to assist with the deposition processes. As shown, the temperature of the wafer traveling through the seventh configuration 800 may be increased as it passes the entrance isolation zone 815 and approaches the deposition zone 830, may be maintained as it travels through the deposition zone 830, and may be decreased as it nears the cool down exhaust zone 835, then the exit nitrogen isolation zone 840 and travels along the remainder of the wafer carrier track.

In one embodiment, the CVD reactor may be configured to grow or deposit a high quality gallium arsenide and aluminum gallium arsenide double heterostructure at a deposition rate of about 1 µm/min; may be configured to grow or deposit a high quality aluminum arsenide epitaxial lateral overgrowth sacrificial layer; and may be configured to provide a throughput of about 6 wafers per minute to about 10 wafers per minute.

In some embodiments, the CVD reactor may be configured to grow or deposit materials on wafers of varying sizes, for example, 4 cm×4 cm or 10 cm×10 cm. In one embodiment the CVD reactor may be configured to provide a 300 nanometer gallium arsenide buffer layer. In another embodiment the CVD reactor may be configured to provide a 30 nanometer aluminum gallium arsenide passivation layer. In another embodiment the CVD reactor may be configured to provide a 1,000 nanometer gallium arsenide active layer. In another embodiment the CVD reactor may be configured to provide a 30 nanometer aluminum gallium arsenide passivation layer. In another embodiment the CVD reactor may be configured to provide a dislocation density of less than $1 \times 10^4$ per $cm^2$; a photoluminescence efficiency of 99%; and a photoluminescence lifetime of 250 nanoseconds.

In another embodiment the CVD reactor may be configured to provide an epitaxial lateral overgrowth layer having a 5 nm deposition±0.5 nm; a etch selectivity greater than $1 \times 10^6$; zero pinholes; and an aluminum arsenide etch rate greater than 0.2 mm per hour. In another embodiment the CVD reactor may be configured to provide a center to edge temperature non-uniformity of no greater than 10° C. for temperatures above 300° C.; a V-III ratio of no more than 5; and a maximum temperature of 800° C.

In one embodiment the CVD reactor may be configured to provide a deposition layers having a 300 nm gallium arsenide buffer layer; a 5 nm aluminum arsenide sacrificial layer; a 10 nm aluminum gallium arsenide window layer; a 700 nm gallium arsenide $2 \times 10^{17}$ Si active layer; a 300 nm aluminum gallium arsenide $1 \times 10^{19}$ C P+ layer; and a 300 nm gallium arsenide $1 \times 10^{19}$ C P+ layer.

In another embodiment the CVD reactor may be configured to provide a deposition layers having a 300 nm gallium arsenide buffer layer; a 5 nm aluminum arsenide sacrificial layer; a 10 nm gallium indium phosphide window layer; a 700 nm gallium arsenide $2 \times 10^{17}$ Si active layer; a 100 nm gallium arsenide C P layer; a 300 nm gallium indium phosphide P window layer; a 20 nm gallium indium phosphide $1 \times 10^{20}$ P+ tunnel junction layer; a 20 nm gallium indium phosphide $1 \times 10^{20}$ N+ tunnel junction layer; a 30 nm aluminum gallium arsenide window; a 400 nm gallium indium phosphide N active layer; a 100 nm gallium indium phosphide P active layer; a 30 nm aluminum gallium arsenide P window; and a 300 nm gallium arsenide P+ contact layer.

Embodiments of the invention generally relate to a levitating substrate carrier or support. In one embodiment, a substrate carrier for supporting and carrying at least one substrate or wafer passing through a reactor is provided which includes a substrate carrier body containing an upper surface and a lower surface, and at least one indentation pocket disposed within the lower surface. In another embodiment, the substrate carrier includes a substrate carrier body containing an upper surface and a lower surface, and at least two indentation pockets disposed within the lower surface. In another embodiment, the substrate carrier includes a substrate carrier body containing an upper surface and a lower surface, an indentation area within the upper surface, and at least two indentation pockets disposed within the lower surface. In another embodiment, the substrate carrier includes a substrate carrier body containing an upper surface and a lower surface, an indentation area within the upper surface, and at least two indentation pockets disposed within the lower surface, wherein each indentation pocket has a rectangular geometry and four side walls which extend perpendicular or substantially perpendicular to the lower surface. In another embodiment, the substrate carrier includes a substrate carrier body containing an upper surface and a lower surface, and at least two indentation pockets disposed within the lower surface, wherein each indentation pocket has a rectangular geometry and four side walls which extend perpendicular or substantially perpendicular to the lower surface.

In another embodiment, a substrate carrier for supporting and carrying at least one substrate passing through a reactor is provided which includes a substrate carrier body containing an upper surface and a lower surface, and at least one indentation pocket disposed within the lower surface. The substrate carrier body may have a rectangular geometry, a square geometry, or another type of geometry. In one example, the substrate carrier body has two short sides and two long sides, wherein one of the two short sides is the front of the substrate carrier body and the other short side is the rear of the substrate carrier body. The substrate carrier body may contain or be made from graphite.

In some examples, the upper surface contains at least one indentation area disposed therein. The indentation area within the upper surface is configured to hold a substrate thereon. In other examples, the upper surface may have at least two, three, four, eight, twelve, or more of the indentation areas. In another example, the upper surface has no indentation areas.

In another embodiment, the lower surface may have at least two of the indentation pockets, which are configured to accept a gas cushion. In some examples, the lower surface has one, three, or more of the indentation pockets. The indentation pocket may have a rectangular geometry, a square geometry, or another type of geometry. Each of the indentation pockets usually has two short sides and two long sides. In one example, the short sides and the long sides are straight. The short sides and the long sides are perpendicular relative to the lower surface. In another example, at least one of the two short sides is tapered at a first angle, at least one of the two long sides is tapered at a second angle, and the first angle may be greater than or less than the second angle. In another example, at least one of the two short sides is straight and at least one of the two long sides is tapered. In another example, at least one of the two short sides is tapered and at least one of the two long sides is straight. In one embodiment, the indentation pocket has a rectangular geometry and the indentation pocket is configured to accept a gas cushion. The indentation pocket may have tapered side walls which taper away from the upper surface.

In another embodiment, a method for levitating substrates disposed on an upper surface of a substrate carrier during a vapor deposition process is provided which includes exposing a lower surface of a substrate carrier to a gas stream, forming a gas cushion under the substrate carrier, levitating the substrate carrier within a processing chamber, and moving the substrate carrier along a path within the processing chamber. In many examples, the movement of the substrate carrier and/or the velocity of the substrate carrier along the path may be controlled by adjusting the flow rate of the gas stream. The air cushion may be formed within at least one indentation pocket disposed within the lower surface. In some examples, the lower surface has at least two indentation pockets. The indentation pockets are configured to accept the gas cushion. An upper surface of the substrate carrier comprises at least one indentation area for supporting a substrate. The indentation pocket may have tapered side walls which taper away from the upper surface of the substrate carrier.

In another embodiment, a method for levitating substrates disposed on a substrate carrier during a vapor deposition process is provided which includes exposing a lower surface of a substrate carrier to a gas stream, wherein at least one wafer is disposed on an upper surface of the substrate carrier and the lower surface contains at least one indentation pocket, forming a gas cushion under the substrate carrier, levitating the substrate carrier within a processing chamber, and moving the substrate carrier along a path within the processing chamber.

In another embodiment, a method for levitating substrates disposed on a substrate carrier during a vapor deposition process is provided which includes exposing a lower surface of a substrate carrier to a gas stream, wherein the lower surface contains at least one indentation pocket, forming a gas cushion under the substrate carrier, levitating the substrate carrier within a processing chamber, and moving the substrate carrier along a path within the processing chamber.

In another embodiment, a method for levitating substrates disposed on a substrate carrier during a vapor deposition process is provided which includes exposing a lower surface of a substrate carrier to a gas stream, wherein the lower surface contains at least two indentation pockets, forming a gas cushion under the substrate carrier, levitating the substrate carrier within a processing chamber, and moving the substrate carrier along a path within the processing chamber.

Embodiments of the invention generally relate to a chemical vapor deposition reactor system and related methods of use. In one embodiment, a chemical vapor deposition system is provided which includes a lid assembly, such as a top plate, having a plurality of raised portions located along the longitudinal axis of the top plate. The system includes a track having a guide path, such as a channel, located along the longitudinal axis of the track, wherein the channel is adapted to receive the plurality of raised portions of the top plate, thereby forming a gap between the plurality of raised portions and a floor of the track, wherein the gap is configured to receive a substrate. The system includes a heating assembly, such as a heating element, operable to heat the substrate as the substrate moves along the channel of the track. In one embodiment, the track is operable to float the substrate along the channel of the track.

In one embodiment, system includes a trough that supports the track. The gap may have a thickness within a range from about 0.5 mm to about 5 mm, or from about 0.5 mm to about 1 mm. The top plate is formed from molybdenum or quartz, the track is formed from quartz or silica. The top plate is operable to direct a gas to the gap and may further include a plurality of ports located along the longitudinal axis of the top plate and disposed between the plurality of raised portions, thereby forming paths between the plurality of raised portions. One or more of the plurality of ports is adapted to communicate and/or exhaust a gas to the gap between plurality of raised portions of the top plate and the floor of the track.

Examples of the heating element include a heating lamp coupled to or with the track, a plurality of heating lamps disposed along the track, a heating lamp bank operable to move along the track as the substrate moves along the channel of the track, resistive heaters coupled to or with the track, an inductive heating source coupled to or with the substrate and/or the track. The heating element is operable to maintain a temperature differential across the substrate, wherein the temperature differential is less than 10° C. In one embodiment, the chemical vapor deposition system is an atmospheric pressure chemical vapor deposition system.

In one embodiment, a chemical vapor deposition system is provided which includes an entrance isolator operable to prevent contaminants from entering the system at an entrance of the system; an exit isolator operable to prevent contaminants from entering the system at an exit of the system; and an intermediate isolator disposed between the entrance and exit isolators. The system may further include a first deposition zone disposed adjacent the entrance isolator and a second deposition zone disposed adjacent the exit isolator. The intermediate isolator is disposed between the deposition zones and is operable to prevent mixing of gases between the first deposition zone and the second deposition zone.

In one embodiment, the entrance isolator is further operable to prevent back diffusion of gases injected into the first deposition zone, the intermediate isolator is further operable to prevent back diffusion of gases injected into the second deposition zone, and the exit isolator is further operable to prevent back diffusion of gases injected into the second deposition zone. An isolation zone formed by at least one of the isolators has a length within a range from about 1 meter to about 2 meters. A gas, such as nitrogen, is injected into the entrance isolator at a first flow rate, such as about 30 liters per minute, to prevent back diffusion of gases from the first deposition zone. A gas, such as arsine, is injected into the intermediate isolator at a first flow rate, such as about 3 liters per minute, to prevent back mixing of gases between the first deposition zone and the second deposition zone. A gas, such as nitrogen, is injected into the exit isolator at a first flow rate, such as about 30 liters per minute, to prevent contaminants from entering the system at the exit of the system. In one embodiment, an exhaust is disposed adjacent each isolator and operable to exhaust gases injected by the isolators. An exhaust may be disposed adjacent each deposition zone and operable to exhaust gases injected into the deposition zones.

In one embodiment, a chemical vapor deposition system is provided which includes a housing, a track surrounded by the housing, wherein the track forms a guide path, such as a channel, adapted to guide the substrate through the chemical vapor deposition system. The system includes a carrier for moving the substrate along the channel of the track, wherein the track is operable to levitate the carrier along the channel of the track. The housing contains or is formed from molybdenum, quartz, or stainless steel, the track contains or is formed from quartz, molybdenum, fused silica, ceramic, and the carrier is formed from graphite.

In one embodiment, the track comprises a plurality of openings and/or a conduit disposed along the floor of the track each operable to supply a cushion of gas to the channel and the bottom surface of the carrier to lift or levitate the carrier and substantially center the carrier along the channel of the track. The conduit may have a v-shape and the carrier may have a notch (e.g. v-shape) disposed along its bottom surface. A gas is applied to the notch of the carrier to substantially lift the carrier from the floor of the track and to substantially center the carrier along the channel of the track. The track may be tilted, such as at an angle less than about 20°, less than about 10°, or between about 1° and about 5°, to allow the substrate to move and float from a first end of the channel to a second end of the channel. The track and/or housing may include multiple segments.

In one embodiment, the system may include a conveyor operable to automatically introduce substrates into the channel, a retriever operable to automatically retrieve substrates from the channel, and/or a heating element operable to heat the substrate. The heating element is coupled to or with the housing, the substrate, and/or the track. The carrier is operable to carry strips of the substrate along the channel of the track.

In one embodiment, a track assembly for moving a substrate through a chemical vapor deposition system is provided which includes a top section having a floor, side supports, such as a pair of rails, disposed adjacent the floor, thereby forming a guide path, such as a channel, to guide the substrate along the floor. A bottom section is coupled to or with the top section to form one or more chambers therebetween. The top section may include a recessed bottom surface and the bottom section may include a recessed top surface to form the chamber. In one embodiment the top section and/or the bottom section is formed from molybdenum, quartz, silica, alumina, or ceramic.

In one embodiment, the top section has a plurality of openings disposed through the floor to provide fluid communication between the chamber and the channel. A cushion of gas, such as nitrogen, is supplied from the chamber to the channel to substantially lift and carry the substrate from and along the floor of the top section. The floor may be tilted, such as at an angle less than about 10°, about 20°, or within range from about 1° to about 5°, to allow the substrate to move and float from a first end of the channel to a second end of the channel.

In one embodiment, the top section has a plurality of openings disposed through the pair of rails adjacent the floor. A gas is supplied through the plurality of openings to substantially center the substrate moving along the channel of the top section. The floor may also include a tapered profile and/or a conduit through which a gas is supplied each operable to substantially center the substrate moving along the channel of the top section. The conduit may have a v-shape and/or the substrate may have a notch (e.g. v-shaped) for receiving a gas cushion disposed along a bottom surface of the substrate operable to substantially center the substrate moving along the channel of the top section.

In one embodiment, the track assembly may include a conveyor operable to automatically introduce substrates into the channel and/or a retriever operable to automatically retrieve substrates from the channel. An injection line may be coupled to or with the bottom section to supply a gas to the chamber through the floor to substantially float the substrate along the floor of the top section. The top section may further include recessed portions adjacent the rails operable to receive reactor lid assembly, such as a top plate. The track assembly may include a trough in which the top section and bottom section are seated. The trough is formed from quartz, molybdenum, or stainless steel.

In one embodiment, a method for forming a multi-layered material during a chemical vapor deposition process is provided which includes forming a gallium arsenide buffer layer on a gallium arsenide substrate; forming an aluminum arsenide sacrificial layer on the buffer layer; and forming an aluminum gallium arsenide passivation layer on the sacrificial layer. The method may further include forming a gallium arsenide active layer (e.g., at about 1,000 nanometers thick) on the passivation layer. The method may further include forming a phosphorous gallium arsenide layer on the active layer. The method may further include removing the sacrificial layer to separate the active layer from the substrate. The aluminum arsenide sacrificial layer may be exposed to an etching solution while the gallium arsenide active layer is separated from the substrate during an epitaxial lift off process. The method may further include forming additional multi-layered materials on the substrate during a subsequent chemical vapor deposition process. The buffer layer may be about 300 nanometers in thickness, the passivation layer may be about 30 nanometers in thickness, and/or the sacrificial layer may be about 5 nanometers in thickness.

In one embodiment, a method of forming multiple epitaxial layers on a substrate using a chemical vapor deposition system is provided which includes introducing the substrate into a guide path, such as a channel, at an entrance of the system, while preventing contaminants from entering the system at the entrance; depositing a first epitaxial layer on the substrate, while the substrate moves along the channel of the system; depositing a second epitaxial layer on the substrate, while the substrate move along the channel of the system; preventing mixing of gases between the first deposition step and the second deposition step; and retrieving the substrate from the channel at an exit of the system, while preventing contaminants from entering the system at the exit. The method may further include heating the substrate prior to depositing the first epitaxial layer; maintaining the temperature of the substrate as the first and second epitaxial layers are deposited on the substrate; and/or cooling the substrate after depositing the second epitaxial layer. The substrate may substantially float along the channel of the system. The first epitaxial layer may include aluminum arsenide and/or the second epitaxial layer may include gallium arsenide. The method may further include depositing a phosphorous gallium arsenide layer on the substrate and/or heating the substrate to a temperature within a range from about 300° C. to about 800° C. during the depositing of the epitaxial layers. A center temperature to an edge temperature of the substrate may be within 10° C. of each other.

In one embodiment, a chemical vapor deposition reactor is provided which includes a lid assembly having a body, and a track assembly having a body and a guide path located along the longitudinal axis of the body. The body of the lid assembly and the body of the track assembly are coupled together to form a gap therebetween that is configured to receive a substrate. The reactor may further include a heating assembly containing a plurality of heating lamps disposed along the track assembly and operable to heat the substrate as the substrate moves along the guide path. The reactor may further include a track assembly support, wherein the track assembly is disposed in the track assembly support. The body of the track assembly may contain a gas cavity within and extending along the longitudinal axis of the body and a plurality of ports extending from the gas cavity to an upper surface of the guide path and configured to supply a gas cushion along the guide path. The body of the track assembly may comprise quartz. The body of the lid assembly may include a plurality of ports configured to provide fluid communication to the guide path. The heating assembly may be operable to maintain a temperature differential across the substrate, wherein the temperature differential is less than 10° C. In one embodiment, the chemical vapor deposition reactor is an atmospheric pressure chemical vapor deposition reactor.

In one embodiment, a chemical vapor deposition system is provided which includes a entrance isolator operable to prevent contaminants from entering the system at an entrance of the system; an exit isolator operable to prevent contaminants from entering the system at an exit of the system; and a intermediate isolator disposed between the entrance and exit isolators. The system may further include a first deposition zone disposed adjacent the entrance isolator and a second deposition zone disposed adjacent the exit isolator. The intermediate isolator is disposed between the deposition zones and is operable to prevent mixing of gases between the first deposition zone and the second deposition zone. A gas is injected into the entrance isolator at a first flow rate to prevent back diffusion of gases from the first deposition zone, a gas is injected into the intermediate isolator at a first flow rate to prevent back mixing of gases between the first deposition zone and the second deposition zone, and/or a gas is injected into the exit isolator at a first flow rate to prevent contaminants from entering the system at the exit of the system. An exhaust may be disposed adjacent each isolator and operable to exhaust gases injected by the isolators and/or disposed adjacent each deposition zone and operable to exhaust gases injected into the deposition zones.

In one embodiment, a chemical vapor deposition system is provided which includes a housing, a track surrounded by the housing, wherein the track contains a guide path adapted to guide a substrate through the chemical vapor deposition system, and a substrate carrier for moving the substrate along the guide path, wherein the track is operable to levitate the substrate carrier along the guide path. The track may include a plurality of openings operable to supply a gas cushion to the guide path. The gas cushion is applied to a bottom surface of the substrate carrier to lift the substrate carrier from a floor of the track. The track may include a conduit disposed along the guide path and operable to substantially center the substrate carrier along the guide path of the track. A gas cushion may be supplied through the conduit to a bottom surface of the substrate carrier to substantially lift the substrate carrier from a floor of the track. The track may be tilted to allow the substrate to move from a first end of the guide path to a second end of the guide path. The system may include a heating assembly containing a plurality of heating lamps disposed along the track and operable to heat the substrate as the substrate moves along the guide path.

While the foregoing is directed to embodiments of the invention, other and further embodiments of the invention may be devised without departing from the basic scope thereof, and the scope thereof is determined by the claims that follow.

The invention claimed is:

1. A gas manifold assembly for vapor deposition processes, comprising:
   a middle section containing a first gas inlet, a first gas manifold extending from the first gas inlet to a first plurality of passageways, and a tube extending along a central axis and containing a first channel along the central axis, the first plurality of passageways being disposed radially around the tube and in fluid communication with the first channel;
   a lower section coupled to the middle section and containing a second gas inlet, a second gas manifold extending from the second gas inlet to a second plurality of passageways, and an opening concentric with the central axis, wherein the tube extends to the opening to form a second channel between the tube and an edge of the opening and the second channel is concentric with the central axis, the second plurality of passageways being disposed radially around the tube and in fluid communication with the second channel, and wherein a first gas flow path extends from the first gas inlet, through the first gas manifold of the middle section, through the first plurality of passageways and through the first channel of the tube and a second gas flow path extends from the second gas inlet, through the second gas manifold of the lower section, through the second plurality of passageways and through the second channel, wherein the first flow path is contained in the middle and lower sections and the second flow path is contained in the lower section; and
   an upper section coupled to the middle section.

2. The gas manifold assembly of claim 1, wherein the tube has a cylindrical geometry and the opening has a circular geometry.

3. The gas manifold assembly of claim 1, wherein the tube extends through the opening and past a lower surface of the lower section.

4. The gas manifold assembly of claim 1, wherein each of the upper section, the middle section, and the lower section independently comprises a material selected from a group consisting of molybdenum, molybdenum alloys, steel, stainless steel, nickel, chromium, iron, and alloys thereof.

5. The gas manifold assembly of claim 1, wherein the tube comprises a material selected from a group consisting of molybdenum, molybdenum alloys, steel, stainless steel, nickel, chromium, iron, and alloys thereof.

6. The gas manifold assembly of claim 1, wherein the second channel extends parallel to the first channel and the central axis.

7. The gas manifold assembly of claim 1 wherein the first gas inlet is at an outer surface of the middle section and the second gas inlet is at an outer surface of the lower section.

\* \* \* \* \*